United States Patent
Park et al.

(10) Patent No.: US 9,778,851 B2
(45) Date of Patent: Oct. 3, 2017

(54) METHOD OF OPERATION FOR A NONVOLATILE MEMORY SYSTEM AND METHOD OF OPERATING A MEMORY CONTROLLER

(71) Applicant: SAMSUNG ELECTRONICS CO., LTD., Suwon-Si, Gyeonggi-Do (KR)

(72) Inventors: Young-Ho Park, Anyang-Si (KR); Chanik Park, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/352,121

(22) Filed: Nov. 15, 2016

(65) Prior Publication Data

US 2017/0160934 A1    Jun. 8, 2017

(30) Foreign Application Priority Data

Dec. 3, 2015    (KR) .................. 10-2015-0171644

(51) Int. Cl.
| | |
|---|---|
| *G11C 16/06* | (2006.01) |
| *G06F 3/06* | (2006.01) |
| *G11C 16/34* | (2006.01) |
| *G11C 16/10* | (2006.01) |
| *G11C 16/26* | (2006.01) |
| *G06F 11/10* | (2006.01) |
| *G11C 29/52* | (2006.01) |

(52) U.S. Cl.
CPC .............. *G06F 3/061* (2013.01); *G06F 3/064* (2013.01); *G06F 3/0619* (2013.01); *G06F 3/0659* (2013.01); *G06F 3/0679* (2013.01); *G06F 11/1068* (2013.01); *G11C 16/10* (2013.01); *G11C 16/26* (2013.01); *G11C 16/3431* (2013.01); *G11C 16/3495* (2013.01); *G11C 29/52* (2013.01)

(58) Field of Classification Search
CPC .............. G11C 16/349; G11C 16/3445; G11C 16/3495; G11C 29/42; G11C 29/52; G11C 11/5628; G11C 29/00; G11C 2029/0411; G11C 16/14; G11C 16/16; G11C 16/26; G11C 29/4401; G11C 16/10; G11C 16/3459; G11C 2029/0409; G11C 2029/4402
USPC ......... 711/103, E12.008, E12.058, 108, 202; 365/185.09, 185.33, 185.29
See application file for complete search history.

(56) References Cited

U.S. PATENT DOCUMENTS

| | | |
|---|---|---|
| 6,643,177 B1 | 11/2003 | Le et al. |
| 6,888,758 B1 | 5/2005 | Hemink et al. |
| 7,054,199 B2 | 5/2006 | Lee et al. |
| 7,613,045 B2 | 11/2009 | Murin et al. |
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,819,503 B2 | 8/2014 | Melik-Martirosian |

(Continued)

*Primary Examiner* — Thong Q Le
(74) *Attorney, Agent, or Firm* — Volentine & Whitt, PLLC

(57) ABSTRACT

A method of operating a nonvolatile memory system including a memory device having a plurality of memory blocks includes selecting a source block among the plurality of memory blocks in the nonvolatile memory system, and performing a reclaim operation for the source block based on the number of program and erase cycles which have been performed on the source block.

19 Claims, 20 Drawing Sheets

(56) References Cited

U.S. PATENT DOCUMENTS

| | | |
|---|---|---|
| 2010/0235713 A1 | 9/2010 | Lee et al. |
| 2011/0233648 A1 | 9/2011 | Seol et al. |
| 2013/0185612 A1 | 7/2013 | Lee et al. |
| 2013/0227200 A1 | 8/2013 | Cometti et al. |
| 2014/0101372 A1 | 4/2014 | Jung et al. |
| 2014/0237165 A1 | 8/2014 | Seo et al. |
| 2014/0310448 A1* | 10/2014 | Nam .................. G11C 11/5628 711/103 |

* cited by examiner

METHOD OF OPERATION FOR A NONVOLATILE MEMORY SYSTEM AND METHOD OF OPERATING A MEMORY CONTROLLER

CROSS-REFERENCE TO RELATED APPLICATIONS

A claim for priority under 35 U.S.C. §119 is made to Korean Patent Application No. 10-2015-0171644 filed Dec. 3, 2015, in the Korean Intellectual Property Office, the entire contents of which are hereby incorporated by reference.

BACKGROUND

Embodiments of the inventive concept relate to a semiconductor memory, and more particularly, to a method of operating a storage device.

A semiconductor memory is implemented using a semiconductor material, such as silicon (Si), germanium (Ge), gallium arsenide (GaAs), indium phosphide (InP), or the like. A semiconductor memory device may be roughly classified as a volatile memory device or a nonvolatile memory device.

A volatile memory device loses data stored therein at power-off. A volatile memory device may be a static random access memory (SRAM), a dynamic ram (DRAM), or a synchronous DRAM. A nonvolatile memory device maintains data stored therein even at power-off. A nonvolatile memory device may be a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

In particular, a flash memory device is a high-capacity storage device and is widely used in various fields. The flash memory device is a nonvolatile memory device but will lose data stored therein due to various factors such as temperature, read disturbance, program disturbance, and charge loss. Accordingly, there are being developed various methods for securing the integrity of data stored in a flash memory device.

SUMMARY

Embodiments of the inventive concepts provide a method of operation for a nonvolatile memory system which may improve performance and reliability.

According to an embodiment of the inventive concept, a method of operation for a nonvolatile memory system includes selecting a source block of a plurality of memory blocks in the nonvolatile memory system, and performing a reclaim operation for the source block based on a number of program and erase cycles which have been performed on the source block.

According to another embodiment of the inventive concept, a method of operation of a nonvolatile memory system includes selecting a source block from a plurality of memory blocks in the nonvolatile memory system, adjusting a reclaim policy for the source block based on a number of program and erase cycles of the selected source block, and performing a reclaim operation for the selected source block based on the adjusted reclaim policy.

According to another embodiment of the inventive concept, a method of operation for a memory controller controlling a nonvolatile memory device includes selecting a source block from a plurality of memory blocks that the nonvolatile memory system includes and performing a reclaim operation for the selected source block based on a number of program and erase cycles of the selected source block. A period in which the reclaim operation may be performed decreases as the number of program and erase cycles of the selected source block increases.

According to yet another embodiment of the inventive concept, a method of operation is provided for a nonvolatile memory system including a nonvolatile memory device having a plurality of memory blocks. The method comprises: selecting a value for a first parameter of a reclaim operation, wherein the first parameter affects an overhead for operations of the nonvolatile memory system due to the reclaim operation; selecting a source block from among the plurality of memory blocks in the nonvolatile memory system; and performing the reclaim operation for the source block using the selected value for the first parameter of the reclaim operation, wherein selecting the value for the first parameter of the reclaim operation is based on a value of a second parameter of the source block which is related to the probability that one or more bit errors occur in the source block.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
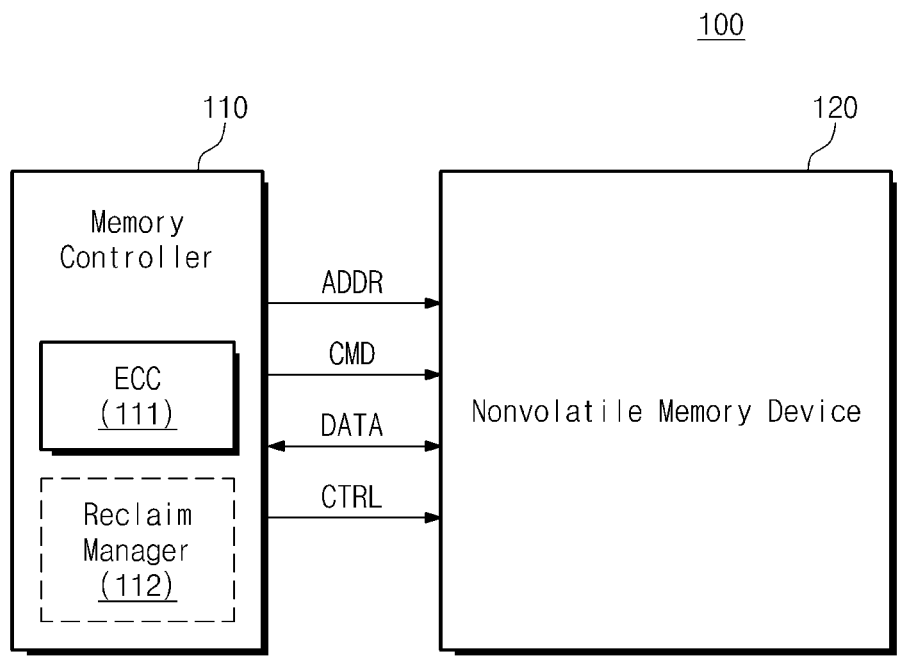
FIG. 1 is a block diagram illustrating a nonvolatile memory system according to an embodiment of the inventive concept.

Hereinafter, exemplary embodiments of the inventive concept in conjunction with accompanying drawings will be described. Below, details, such as detailed configurations and structures, are simply provided to help understand embodiments of the inventive concept. Embodiments described herein may be variously changed or modified without departing from an embodiment of the inventive concept. Moreover, descriptions about well-known functions and structures are omitted for the sake of clarity and brevity. The terminology used herein is for the purpose of describing particular embodiments only and is not intended to be limiting of the invention. The definition of terminology used herein may be determined based on the details described in the detailed description.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Hereinafter, the modules in the drawings and in the detailed description may be connected with other things in addition to the components which are illustrated in the drawings or are described in the detailed description. Each connection between modules or elements may be direct or indirect. Each connection between modules or components may be a connection by communication or may be a physical connection.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Below, for descriptive convenience, embodiments of the inventive concept will be explained based on specific examples. However, embodiments of the inventive concept may not be limited thereto. For example, a variety of embodiments or combinations thereof may be implemented.

To improve the integrity of data, a nonvolatile memory system according to an embodiment of the inventive concept may perform a read reclaim operation (or a reclaim operation). In this case, the nonvolatile memory system may adjust a reclaim policy based on the number of program and erase cycles (hereinafter referred to as "P/E cycles" or "P/E cycle frequency") which have been performed on a source block which is an object of the reclaim operation, thereby improving the performance of the nonvolatile memory system overall. Moreover, the nonvolatile memory system with the improved performance and an operating method thereof may be provided.

FIG. 1 is a block diagram illustrating a nonvolatile memory system 100 according to an embodiment of the inventive concept. Referring to FIG. 1, nonvolatile memory system 100 may include a memory controller 110 and a nonvolatile memory device 120. In example embodiments, each of memory controller 110 and nonvolatile memory device 120 may be implemented with one chip, one package, or one module. In example embodiments, nonvolatile memory system 100 may be a mass storage medium or storage device such as a solid state drive (SSD), a memory card, or a memory stick.

The memory controller 110 may control nonvolatile memory device 120 based on the request of an external device (e.g., a host, CPU, or AP). For example, memory controller 110 may transmit an address ADDR, a command CMD, and a control signal CTRL to nonvolatile memory device 120 based on the request of an external device. Memory controller 110 may exchange data DATA with nonvolatile memory device 120 based on the request of an external device.

Under control of memory controller 110, nonvolatile memory device 120 may store the data DATA therein or may output the data DATA stored therein. Nonvolatile memory device 120 may be provided based on a NAND flash memory including a plurality of memory blocks. However, an embodiment of the inventive concept may not be limited thereto. Nonvolatile memory device 120 may include nonvolatile memory devices, such as a NOR flash memory, a magnetic RAM (MRAM), a phase-change RAM (PRAM), a resistive RAM (ReRAM), and a ferroelectric RAM (FRAM).

Nonvolatile memory device 120 may include a plurality of nonvolatile memory blocks. Each of the plurality of memory blocks may include a plurality of memory cells, and each of the plurality of memory cells may be a single level cell (SLC) storing one bit or a multi-level cell (MLC) storing at least two bits. In example embodiments, nonvolatile device 120 may erase data stored in nonvolatile memory device 120 by a unit of memory block. Thus, the memory block may indicate an erase unit.

In example embodiments, memory controller 110 may perform various operations for securing the integrity of data stored in nonvolatile memory device 120. For example, memory controller 110 may include an error correction code (ECC) circuit 111 and a reclaim manager 112. ECC circuit 111 may generate an error correction code for data to be stored in nonvolatile memory device 120, or may detect and correct an error of data read from nonvolatile memory device 120 based on the error correction code.

In example embodiments, ECC circuit 111 may has an error correction capability of a specific level. For example, ECC circuit 111 may detect and correct an error that is corrected using the error correction capability. ECC circuit 111 may not detect and correct an error that is not corrected using the error correction capability. Error data that is not corrected by ECC circuit 111 may be referred to as 'uncorrectable error correction code (UECC) data.' When the data read from nonvolatile memory device 120 is UECC data, it may be impossible to secure the integrity of data read from nonvolatile memory device 120.

To prevent the occurrence of UECC data, reclaim manager 112 may perform a reclaim operation for a memory block or page in which data, including error bits of which the number is greater than or equal to a reference value, is stored. For example, as a program, read, or erase operation for the nonvolatile memory device 120 is performed, or as a time elapses, threshold voltages of a plurality of memory cells of nonvolatile memory device 120 may change. This may mean that an error is generated in the data read from nonvolatile memory device 120. ECC circuit 111 may detect an error bit in the data read from nonvolatile memory device 120. Reclaim manager 112 may compare the number of the detected error bits with the reference value to determine whether to reclaim a memory block in which the read data DATA is stored. When the number of the detected error bits is greater than the reference value, reclaim manager 112 may select a memory block, in which the read data DATA is stored, as a source block. Reclaim manager 112 may perform a reclaim operation for the source block, thereby securing the integrity of data stored in the source block. In example embodiments, the reference value may indicate a number of error bits which is less than the number of error bits that is correctable by ECC circuit 111.

Reclaim manager 112 according to an embodiment of the inventive concept may adjust a reclaim policy based on the number of P/E cycles which have been performed on a source block. For example, when the number of P/E cycles of the source block is a first value, reclaim manager 112 may adjust the reclaim policy such that the speed of a reclaim operation for the source block becomes a first speed. When the number of P/E cycles of the source block is a second value greater than the first value, reclaim manager 112 may adjust the reclaim policy such that the speed of the reclaim operation for the source block becomes a second speed faster than the first speed.

In more detail, as the number of P/E cycles which have been performed on the source block increases, reclaim manager 112 may increase the reclaim speed. Alternatively, as the number of P/E cycles of the source block decreases, reclaim manager 112 may decrease the reclaim speed. In example embodiments, the speed of a reclaim operation, or the reclaim speed, may indicate a count of operations performed from a point in time (or a read count) when a block is selected as the source block to a point in time (or a read count) when the reclaim operation is completed. In example embodiments, the read count may indicate the number of occurrences of read operations performed in nonvolatile memory system 100 based on the request of an external device (e.g., a host, CPU, or AP).

In example embodiments, the reclaim policy may include factors such as a reclaim speed, a reclaim execution period, a sub-operation period of a reclaim operation, the sub-operation unit of a reclaim operation, etc. In example embodiments, the reclaim speed may be changed by adjusting the reclaim execution period, the sub-operation period of the reclaim, and/or the sub-operation unit of the reclaim operation.

Figure 2:
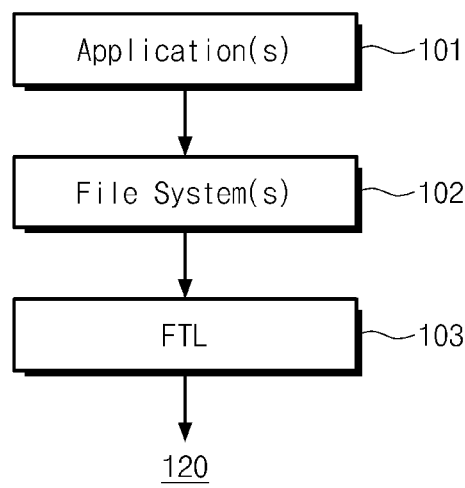
FIG. 2 is a block diagram illustrating a software layer of a nonvolatile memory system of FIG. 1.

FIG. 2 is a block diagram illustrating a software layer of nonvolatile memory system 100 of FIG. 1. Referring to FIGS. 1 and 2, the software layer of nonvolatile memory system 100 may include an application 101, a file system 102, and a flash translation layer (FTL) 103. In example embodiments, application 101 and file system 102 may be included in an external device (e.g., a host, CPU, or AP) or may be driven by the external device.

Application 101 may include various programs driven on the operating system of an external device. For example, application 101 may include various programs such as a text editor, a video player, a web browser, etc.

File system 102 may organize a file or data used by application 101. For example, file system 102 may provide an address of a file or data. In example embodiments, the address may be a logical address organized or managed by the external device. File system 102 may be provided in various formats determined according to an operating system. For example, file system 102 may include a file allocation table (FAT), FAT32, a new technology file system (NTFS), a hierarchical file system (HFS), a journaled file system2 (JSF2), an external file system (XFS), an on-disk structure-5 (ODS-5), a universal disk format (UDF), a zettabyte file system (ZFS), a UNIX file system (UFS), an EXT2, an EXT3, an EXT4, a ReiserFS, a Reiser4, an ISO 9660, a Gnome VFS, a broadcast file system (BFS), or a WinFS.

FTL 103 may provide an interface between the external device and nonvolatile memory device 120 to allow nonvolatile memory device 120 to efficiently be used therein. For example, FTL 103 may perform an operation to translate a logical address provided from an external device into a physical address to be used in nonvolatile memory device 120. FTL 103 may perform the above-described address translation operation through a mapping table (not shown).

In example embodiments, FTL 103 may perform operations such as garbage collection, wear leveling, and a reclaim operation. For example, FTL 103 may perform the garbage collection to obtain a free block of nonvolatile memory device 120. FTL 103 may manage or count the number of P/E cycles of each memory block. FTL 103 may perform the wear leveling such that the number of P/E cycles becomes uniform for each memory block in nonvolatile memory device 120. In example embodiments, reclaim manager 112 described above may be included in FTL 103. FTL 103 may perform a reclaim operation to secure the integrity of data stored in nonvolatile memory device 120.

Figure 3:
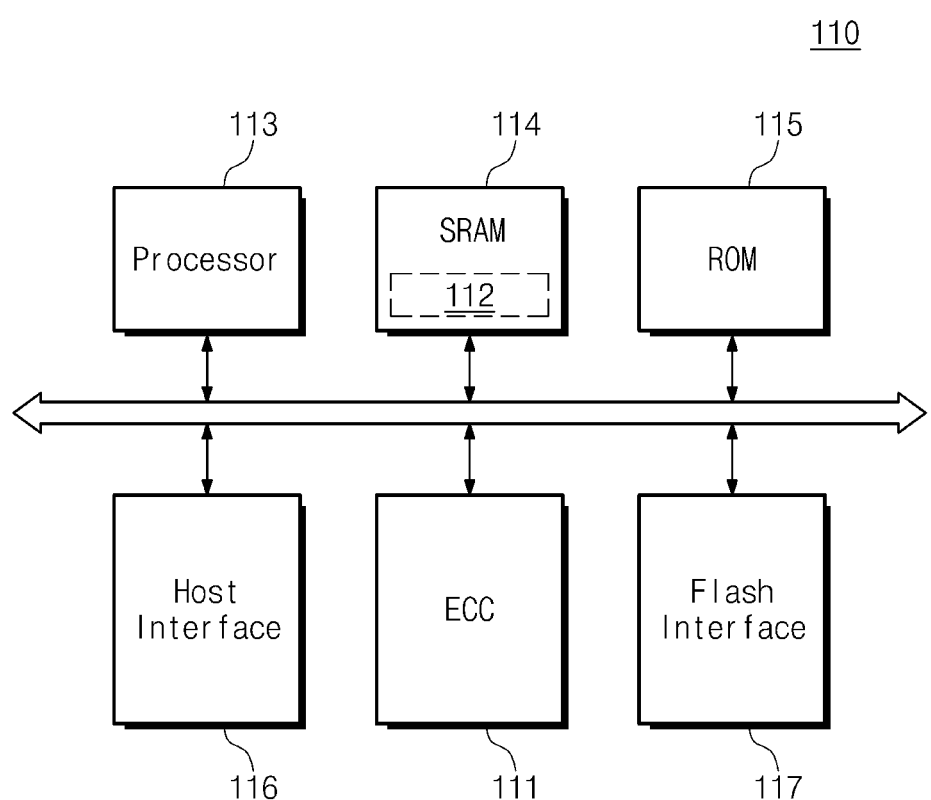
FIG. 3 is a block diagram illustrating a memory controller of FIG. 1.

FIG. 3 is a block diagram illustrating an example embodiment of memory controller 110 of FIG. 1. Referring to FIGS. 1 and 3, memory controller 110 may include ECC circuit 111, a processor 113, an SRAM 114, a ROM 115, a host interface 116, and a flash interface 117.

Processor 113 may perform an overall operation of memory controller 110. SRAM 114 may be used as a buffer memory, a cache memory, or a working memory of memory controller 110. ROM 115 may store a variety of information for the operation of memory controller 110 in the form of firmware. In example embodiments, reclaim manager 112 of FIG. 1 or FTL 103 of FIG. 2 may be provided in the form of software, reclaim manager 112 or FTL 103 may be stored in SRAM 114 and may be driven by processor 113.

Memory controller 110 may communicate with an external device through host interface 116. In example embodiments, memory controller 116 may be provided based on at least one communication protocol such as a universal serial bus (USB), a multimedia card (MMC), an embedded MMC (eMMC), a peripheral component interconnection (PCI), a PCI-express (PCI-E), an advanced technology attachment (ATA), a serial-ATA, a parallel-ATA, a small computer small interface (SCSI), an enhanced small disk interface (ESDI), an integrated drive electronics (IDE), a firewire, a universal flash storage (UFS), or a nonvolatile memory express (NVMe). Memory controller 110 may communicate with nonvolatile memory device 120 through flash interface 117.

Figure 4:
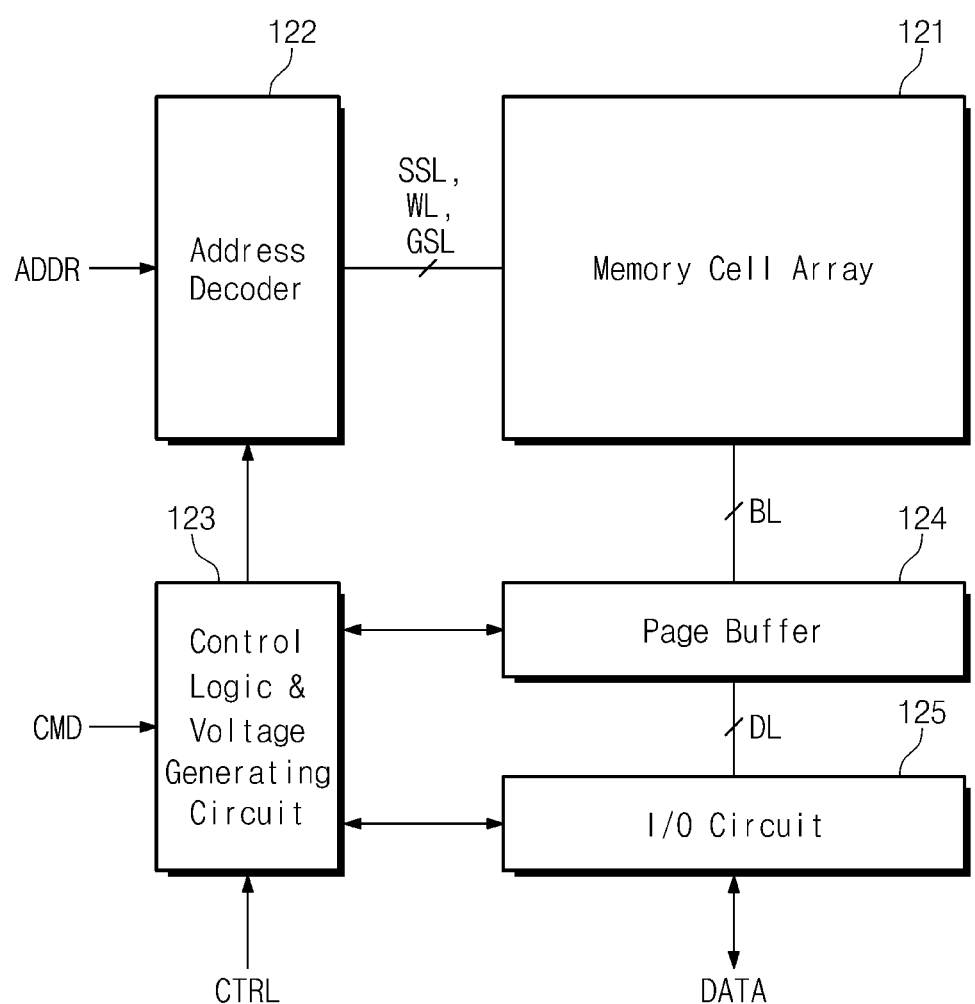
FIG. 4 is a block diagram illustrating a nonvolatile memory device of FIG. 1.

FIG. 4 is a block diagram illustrating an example embodiment of nonvolatile memory device 120 of FIG. 1. Referring to FIGS. 1 and 4, nonvolatile memory device 120 may include a memory cell array 121, an address decoder 122, control logic and voltage generator circuit 123, a page buffer 124, and an input/output circuit 125.

Memory cell array 121 may include a plurality of memory blocks. Each of the memory blocks may include a plurality of cell strings. Each of the cell strings may include a plurality of memory cells, and the memory cells are connected with a plurality of word lines WL, respectively.

Address decoder 122 may be connected with memory cell array 121 through the word lines WL, string selection lines SSL, and ground selection lines GSL. address decoder 122 may receive the address ADDR from memory controller 110 and decode the received address ADDR. Address decoder 122 may select at least one of the word lines WL based on the decoded address ADDR and may control the voltage of the selected word line.

Control logic and voltage generator circuit 123 may receive a command CMD and a control signal CTRL from memory controller 110 and may control address decoder 122, page buffer 124, and input/output circuit 125 in response to the received signals.

Control logic and voltage generator circuit 123 may generate various voltages for the operation of nonvolatile memory 120. For example, control logic and voltage generator circuit 123 may generate various voltages such as program voltages, pass voltages, selection read voltages, non-selection read voltages, verification voltages, erase voltages, and erase verification voltages. In example embodiments, each of the various voltages such as the program voltages, the pass voltages, the selection read voltages, the non-selection read voltages, the verification voltages, the erase voltages, and the erase verification voltages may be changed according to the size, the operating speed, and the physical location of each of the memory cells included in memory cell array 121.

Page buffer 124 may be connected to memory cell array 121 through a plurality of bit lines BL. Page buffer 124 may be connected to input/output circuit 125 through a plurality of data lines DL. Page buffer 124 may control the bit lines BL such that the data DATA received through the data lines DL is written in memory cell array 121. Page buffer 124 may detect a voltage variation of the bit lines BL to read data stored in memory cell array 121. Page buffer 124 may provide the read data DATA to input/output circuit 125 through the data lines DL.

Input/output circuit 125 may exchange the data DATA with module controller 110. Under control of control logic and voltage generator circuit 123, input/output circuit 125 may receive the data DATA from memory controller 110 or may output the data DATA to memory controller 110 in synchronization with a control signal CTRL.

Figure 5:
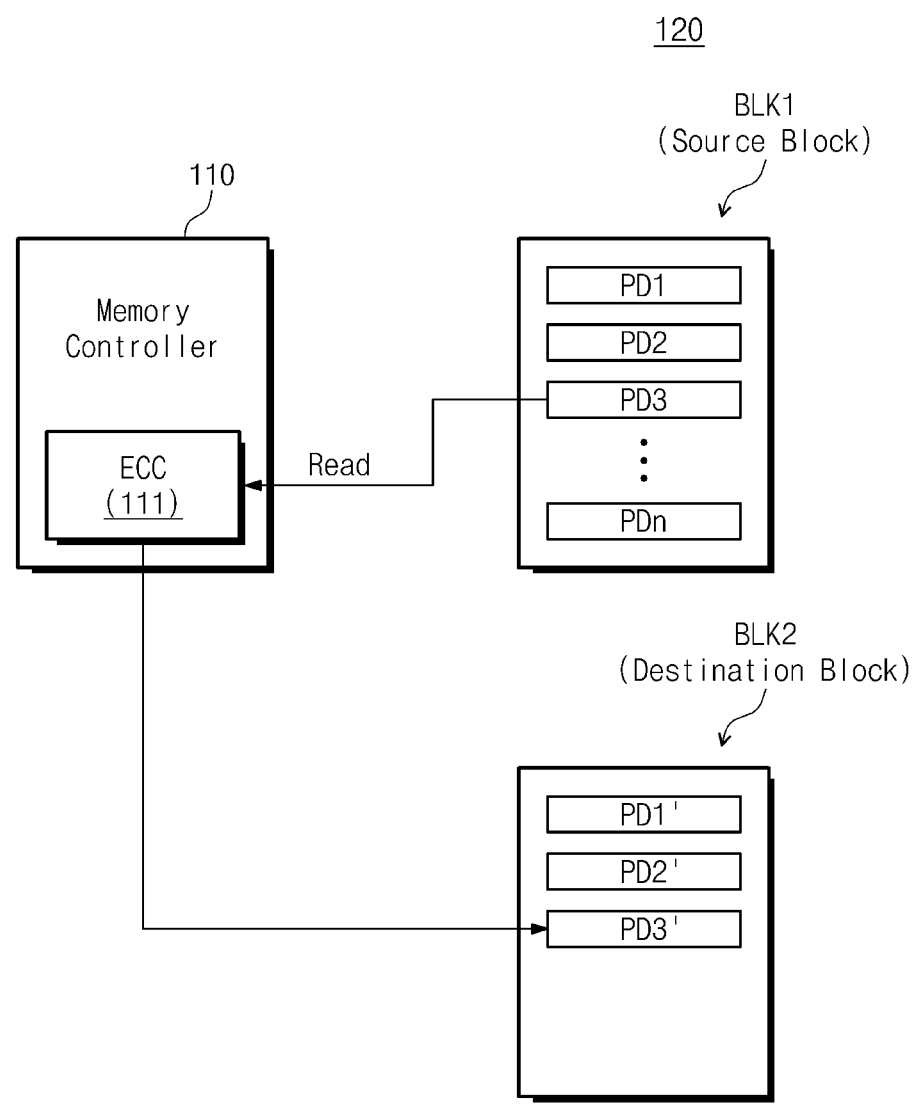
FIG. 5 is a block diagram illustrating a reclaim operation of a nonvolatile memory system of FIG. 1.

FIG. 5 is a block diagram illustrating an example embodiment of a reclaim operation of nonvolatile memory system 100 of FIG. 1. For descriptive convenience and ease of illustration, an erroneous bit of data read from the memory block is referred to as "error bit of the memory block."

Referring to FIGS. 1 and 5, nonvolatile memory system 100 may select a first memory block BLK1 as a source block. As described above, for example, memory controller 110 may read first page data PD1 included in the first memory block BLK1. An error of the first page data PD1 read from the first memory block BLK1 may be detected and corrected by ECC circuit 111. When the number of error bits detected from the read page data is greater than the reference value, memory controller 110 may select the first memory block BLK1, in which the first page data PD1 is stored, as the source block. In example embodiments, the source block may indicate a memory block corresponding to an object for a read reclaim operation.

Memory controller 110 may sequentially read page data from the first memory block BLK1 being the source block and may program the read page data in a second memory block BLK2 being a destination block. In example embodiments, an error of the data read from the first memory block BLK1 may be corrected by ECC circuit 111, and page data of which the error is corrected may be programmed at the second memory block BLK2. That is, data of which the error is corrected may be programmed in the second memory block BLK2, thereby securing the integrity of data. In example embodiments, as data of which the error is corrected is programmed in the second memory block BLK2, FTL 103 (refer to FIG. 2) may update a mapping table for data of which the error is corrected.

Below, for descriptive convenience, it is assumed that a reclaim operation for the first memory block BLK1 being the source block includes a plurality of sub-operations. It is assumed that one sub-operation includes at least one of an operation of reading at least one page data from the source block, an operation of correcting an error of the at least one read page data, or an operation of programming a page of data, of which the at least one error is corrected, at a destination block. That is, memory controller 100 may iteratively perform a plurality of sub-operations to complete a reclaim operation for one source block.

In example embodiments, memory controller 110 may continuously or discontinuously perform sub-operations, respectively. In example embodiments, after performing a first sub-operation, memory controller 110 may perform a second sub-operation after a specific time elapses (or after a specific read count). However, an embodiment of the inventive concept may not be limited thereto.

Figure 6:
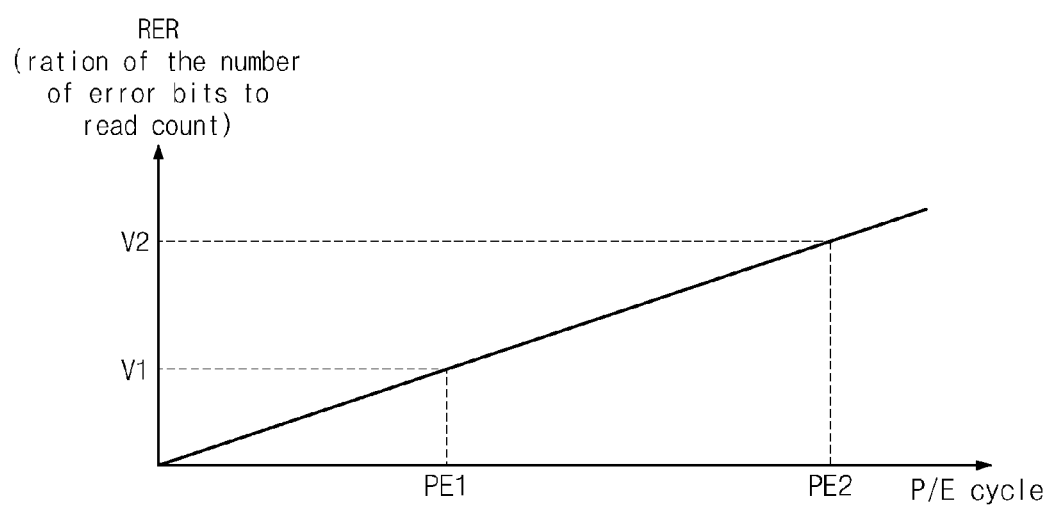
FIG. 6 is a graph illustrating an error bit rate as a function of the number of P/E cycles of a memory block.

FIG. 6 is a graph illustrating an error bit rate as a function of the number of P/E cycles of a memory block. Referring to FIGS. 1 and 6, in FIG. 6, the X-axis indicates the number of P/E cycles of a memory block, and the Y-axis indicates a ratio of error bits to the read count (RER). In example embodiments, the read count may indicate the number of times that data is read from the memory block after a memory block is erased.

As illustrated in FIG. 6, the ratio of error bits to the read count, RER, for a memory block having a first P/E cycle value PE1 may be a first value V1, and the ratio of error bits to the read count, RER, for a memory block having a second P/E cycle value PE2 greater than the first P/E cycle value PE1 may be a second value V2 greater than the first value V1. In example embodiments, the P/E cycle value may indicate the number of P/E cycles. That is, as the number of P/E cycles of a memory block increases, the ratio of error bits to the read count may increase. In other words, since degradation of the memory block increases as the number of P/E cycles of a memory block increases, the probability that error bits occur may increase.

Figure 7:
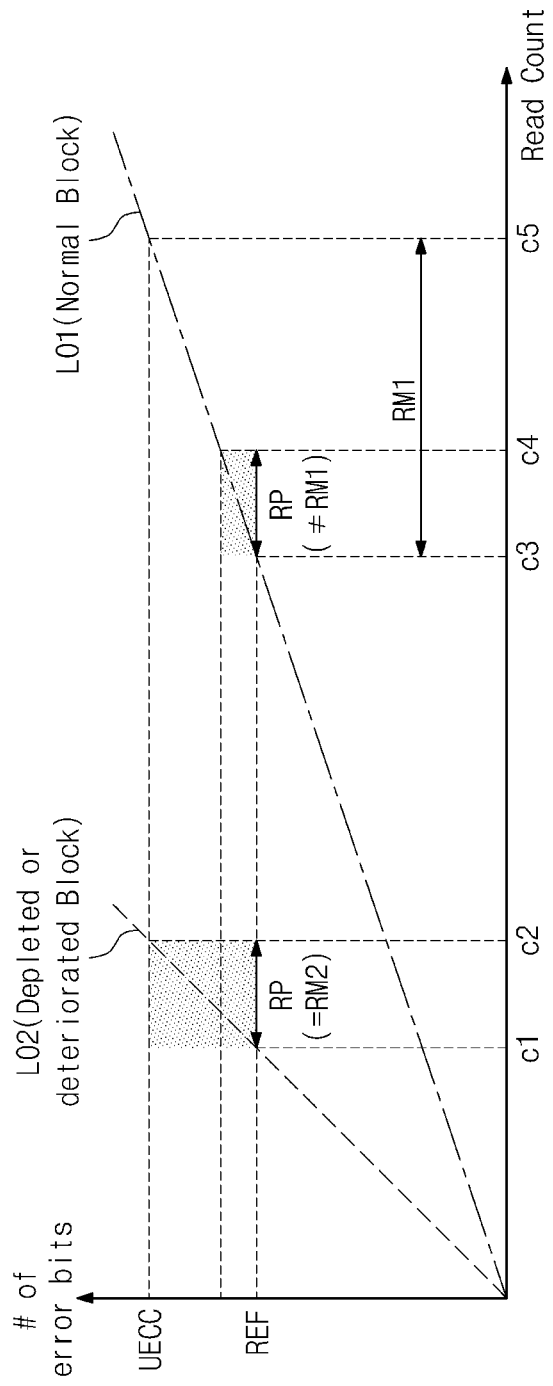
FIG. 7 is a graph illustrating the number of error bits as a function of the read count of a memory block.

FIG. 7 is a graph illustrating the number of error bits as a function of a read count of a memory block. In FIG. 7, the X-axis indicates the read count, and the Y-axis indicates the number of error bits.

Referring to FIGS. 1, 6, and 7, a first line L01 is a graph illustrating the number of error bits for the read count of a memory block having the first P/E cycle value PE1. A second line L02 is a graph illustrating the number of error bits for the read count of a memory block having the second P/E cycle value PE2. In example embodiments, slopes of the first and second lines L01 and L02 may correspond to values (i.e., the ratio of error bits to read count) of the Y-axis of FIG. 6, respectively.

Below, for descriptive convenience, a memory block having the first P/E cycle value PE1 may be referred to as a "normal block", and a memory block having the second P/E cycle value PE2 greater than the first P/E cycle value PE1 may be referred to as a "depleted or deteriorated block". That is, a depleted or deteriorated block may have the number of P/E cycles, a degradation degree, and the number of error bits for the same read count, that are greater than a normal block. For example, as illustrated in FIG. 7, for the same read count, a value of the first line L01 may be less than that of the second line L02. That is, when the read counts are identical, a normal block may have fewer error bits than a depleted or deteriorated block. In example embodiments, the above-described assumption may be to simply describe an embodiment of the inventive concept, and an embodiment of the inventive concept may not be limited thereto. What is considered to be or treated as a depleted or deteriorated block and what is considered to be or treated as a normal block may be relative to each other, and the number of P/E cycles which may be used as a parameter to distinguish between a depleted or deteriorated block, and a normal block, may be varied to have any of various values.

As described above, when the number of error bits of the memory block is greater than or equal to a reference value REF, nonvolatile memory system 100 may select a memory block which includes more error bits than the reference value REF as the source block and may perform a reclaim operation for the source block.

For example, the number of error bits of a depleted or deteriorated block may be greater than or equal to the reference value REF at a first read count c1. In this case, nonvolatile memory system 100 may select the depleted or deteriorated block as the source block at the read count c1 and may begin to perform a reclaim operation for the source block during a reclaim execution period RP.

In example embodiments, the number of error bits of the depleted or deteriorated block may exceed the error correction capability of ECC circuit 111 at a second read count c2. That is, when data is read from the depleted or deteriorated block at the second read count c2, the read data may be uncorrectable error correction code (UECC) data. In this case, since the integrity of data read from the depleted or deteriorated block is not secured, nonvolatile memory system 100 may complete the reclaim operation for the source block before the second read count c2.

In example embodiments, a difference between the first read count c1 and the second read count c2 may be referred to as "reclaim margin (RM)". In other words, a read count (or time) from a point in time when a memory block is selected as the source block to be reclaimed to a point in time when UECC data occurs may be referred to as the "reclaim margin". That is, when the reclaim operation for the source block is completed within the reclaim margin, the integrity of data of the source block may be secured.

In example embodiments, a read count period in which the reclaim operation is performed may be referred to as a "reclaim execution period RP." That is, the reclaim execution period RP may have a value less than the reclaim margin (RM) to secure the integrity of data of the source block. Values of the reclaim execution period RP and a second reclaim margin RM2 for the depleted or deteriorated block may be equal to or approximate to each other.

Since the number of error bits for a normal block (i.e., a memory block having the number of a first P/E cycles PE1) is greater than the reference value REF at a third read count c3, the normal block may be selected as the source block. Nonvolatile memory system 100 may perform a reclaim operation for a source block selected at the third read count c3.

In example embodiments, the nonvolatile memory system may include a plurality of memory blocks, and P/E cycle frequencies of the plurality of memory blocks may be different from each other. To secure the integrity of data of all the memory blocks, a conventional nonvolatile memory system may perform a reclaim operation under the condition that a worst case reclaim margin, (i.e., a reclaim margin which is required for a depleted or deteriorated block of which the number of P/E cycles is great), is applied to all the memory blocks.

For example, with the first line L01 illustrated in FIG. 7, the reclaim margin of the normal block may be a first reclaim margin RM1, but the reclaim execution period RP in which an actual reclaim operation is performed may be shorter than the first reclaim margin RM1. In this case, since the reclaim operation is performed in a short time without considering the characteristics of a memory block, an unnecessarily high overhead to operations of the nonvolatile memory system due to the reclaim operation may occur. Accordingly, the performance of the nonvolatile memory system may be reduced overall.

A nonvolatile memory system according to an embodiment of the inventive concept may adjust a reclaim policy based on the number of P/E cycles of the source block. In example embodiments, the reclaim policy may include factors such as reclaim speed, a reclaim execution period, a sub-operation period of the reclaim, a sub-operation unit of the reclaim operation. Since the reclaim policy is changed according to the number of P/E cycles of the source block, the overhead due to the reclaim operation may decrease during a reclaim operation for a normal block. In more detail, the nonvolatile memory system 100 may minimize the overall performance drop, and thus a reclaim operation for memory blocks of which the number of P/E cycles is small may be performed.

Figure 8:
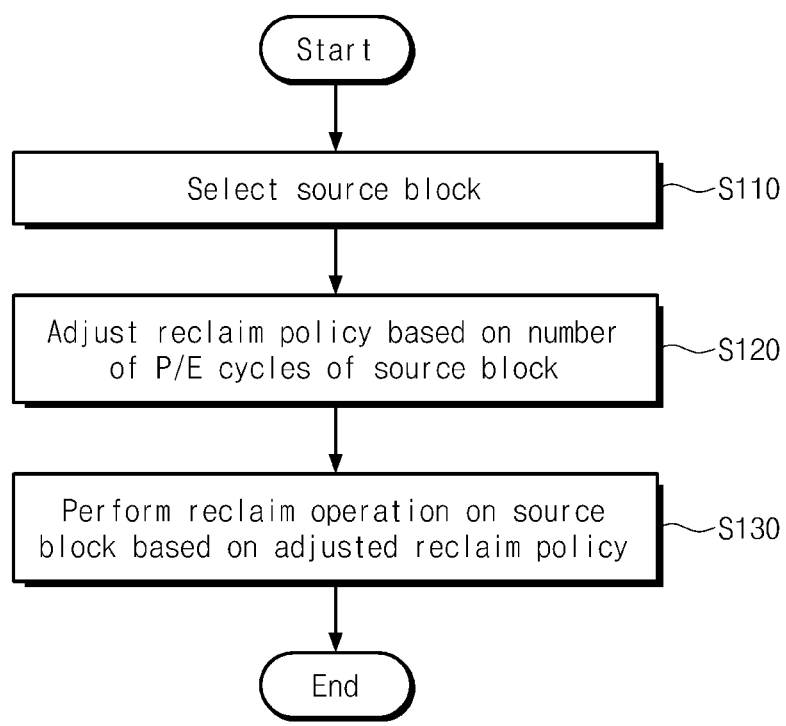
FIG. 8 is a flow chart illustrating an operation of a nonvolatile memory system of FIG. 1.

FIG. 8 is a flow chart illustrating an operation of nonvolatile memory system 100 of FIG. 1. Referring to FIGS. 1 and 6, in step S110, nonvolatile memory system 100 may select a source block. In more detail, memory controller 110 may perform a read operation based on the request of an external device. During a read operation, when the number of error bits of data read from nonvolatile memory device 120 exceeds a reference value, a memory block in which the read data is stored may be selected as a source block.

In step S120, nonvolatile memory system 100 may adjust a reclaim policy based on the number of P/E cycles of the source block. In example embodiments, the reclaim policy may include operating conditions for performing the reclaim operation for the source block. The reclaim policy may include factors such as reclaim speed, a reclaim execution period, a sub-operation period of the reclaim operation, a sub-operation unit of the reclaim operation, etc.

For example, when the number of P/E cycles of the source block is a first value, nonvolatile memory system 100 may adjust a reclaim speed for the selected source block to a first speed. For example, when the number of P/E cycles of the source block is a second value greater than the first value, the nonvolatile memory system 100 may adjust the reclaim speed for the selected source block to a second speed faster than the first speed. That is, nonvolatile memory system 100 may adjust the reclaim speed for the source block based on the number of P/E cycles of the source block.

Likewise, nonvolatile memory system 100 may adjust a reclaim policy for the reclaim operation of the source block such as a reclaim execution period, a sub-operation period of the reclaim, a sub-operation unit of the reclaim operation based on the number of P/E cycles of the source block etc.

In step S130, nonvolatile memory system 100 may perform a reclaim operation for the source block based on the adjusted reclaim policy. An operation that is performed in step S130 will be described with reference to accompanying drawings.

Figure 9:
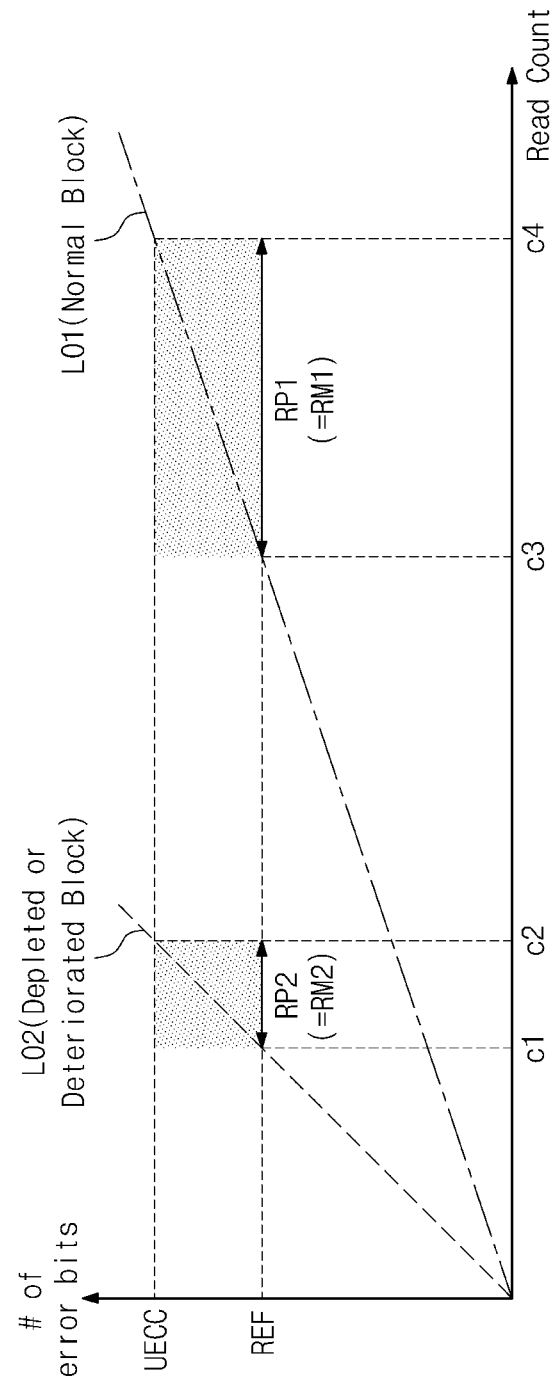
FIGS. 9 and 10 are graphs for describing an operation method of FIG. 8.
Figure 10:
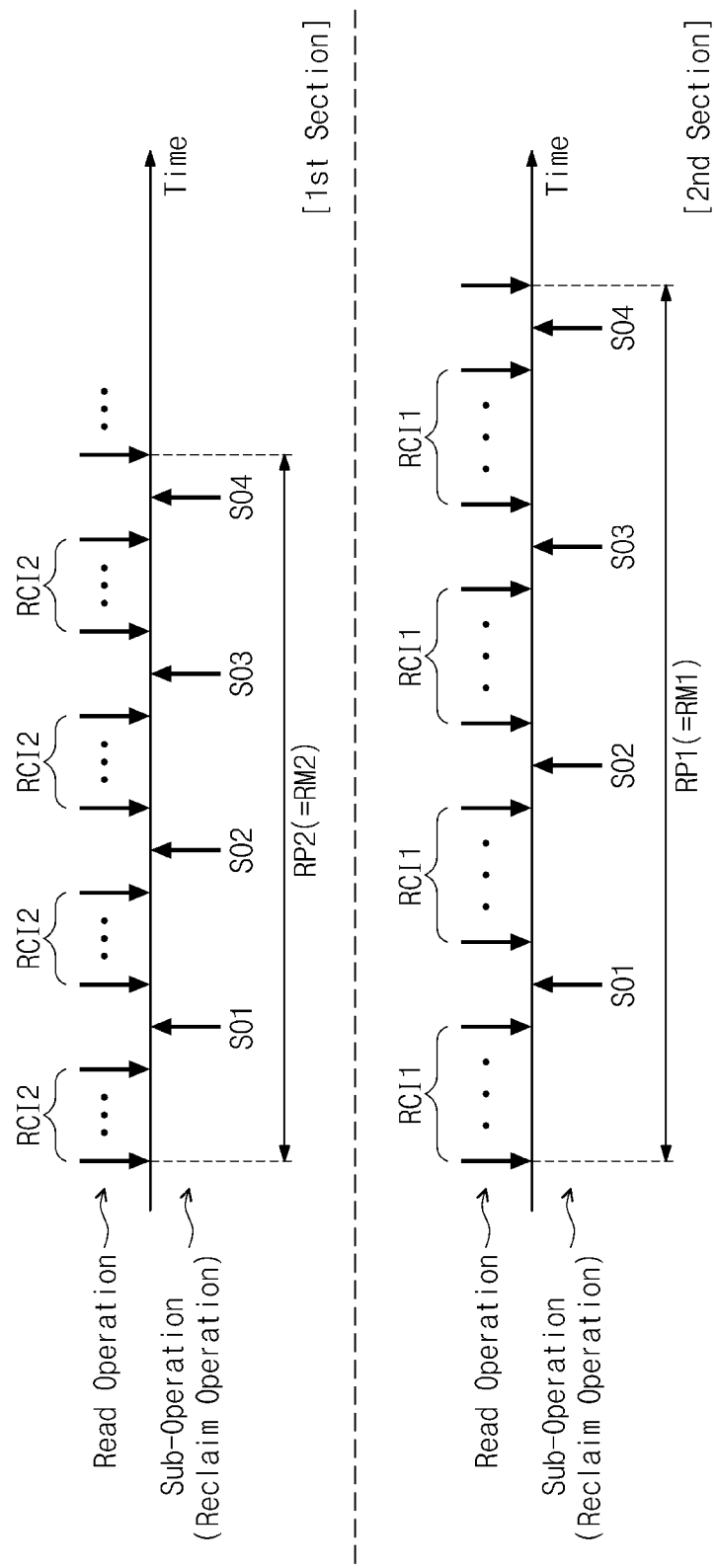

FIGS. 9 and 10 are graphs for describing an operation method of FIG. 8. For descriptive convenience, a description overlapped with an above-described component may be omitted. Furthermore, for descriptive convenience, an operation method according to an embodiment of the inventive concept will be described with reference to a normal block having the first P/E cycle value PE1 and a depleted or deteriorated block having the second P/E cycle value PE2. In addition, the first and second lines L01 and L02 are graphs corresponding to the normal block and the depleted or deteriorated block, respectively.

The above-described embodiment is an example. However, an embodiment of the inventive concept may not be limited thereto. In FIG. 9, the X-axis indicates a read count for nonvolatile memory device 120, and the Y-axis indicates the number of error bits.

First, referring to FIGS. 1, 8 and 9, the error bits of the depleted or deteriorated block may be greater than or equal to the reference value REF at a first read count c1. In this case, the depleted or deteriorated block may be selected as the source block, and nonvolatile memory system 100 may perform a reclaim operation for the depleted or deteriorated block selected as the source block during a second reclaim execution period RP2. At this time, the second reclaim execution period RP2 may be the same as a second reclaim margin RM2 being the reclaim margin for the depleted or deteriorated block. That is, nonvolatile memory system 100 may perform a reclaim operation for the source block during the second reclaim margin RM2.

On the other hand, the error bits of the normal block may be greater than or equal to the reference value REF at a third read count c3. In this case, the normal block may be selected as the source block, and nonvolatile memory system 100 may perform the reclaim operation for the normal block selected as the source block during a first reclaim execution period RP1. At this time, the first reclaim execution period RP1 may be the same as a first reclaim margin RM1 being the reclaim margin for the normal block.

In example embodiments, unlike the embodiment of FIG. 7, in an embodiment of the inventive concept illustrated in FIG. 9, the first reclaim margin RM1 of FIG. 9 may be greater than the second reclaim margin RM2. That is, nonvolatile memory system 100 may increase the reclaim execution period RP for a normal block to reduce the reclaim operation performed per unit read count (or unit time). Moreover, the reclaim operation for the source block may be completed before the UECC data occurs. In other words, the nonvolatile memory system may adjust the reclaim execution period (that is, a period or read count in which an active reclaim operation is performed), thereby improving the reliability and performance of the nonvolatile memory system.

Next, referring to FIGS. 1 and 10, a reclaim operation for each of the depleted or deteriorated block and the normal block will be described. For descriptive convenience, it is assumed that a read operation of nonvolatile memory system 100 is performed in a read intensive case. It may be assumed that the read operation is performed by the request of the external device based on specific time intervals.

In addition, it is assumed that each of reclaim operations for the depleted or deteriorated block and the normal blocks includes a first to fourth sub-operations SO1 to SO4. That is, when the first to fourth sub-operations SO1 to SO4 are completed, a reclaim operation for one source block may be completed. As described above, it is assumed that each of the first to fourth sub-operations SO1 to SO4 includes at least one of an operation of reading at least one page of data from the source block, an operation of correcting an error of the read page of data, or an operation of programming a page of data, of which the error is corrected, at a destination block. However, an embodiment of the inventive concept may not be limited thereto.

Referring to FIGS. 1, 8 to 10, each of the first to fourth sub-operations SO1 to SO4 may be performed during a specific interval based on the reclaim policy. For example, nonvolatile memory system 100 may select a depleted or deteriorated block as the source block. In this case, nonvolatile memory system 100 may adjust the reclaim policy based on the second P/E cycle value PE2 of the source block.

In more detail, as illustrated in a first section of FIG. 10, nonvolatile memory system 100 may adjust a read count interval of the reclaim operation for the depleted or deteriorated block as a second read count interval RCI2. In example embodiments, a read count interval RCI may indicate a read count interval (or a time interval) between points in time when the plurality of sub-operations included in the reclaim operation are respectively performed. That is, the reclaim operation may be quickly completed as the read count interval RCI is shortened (that is, reclaim speed may increase). In example embodiments, the specific number of occurrences of read operations may be performed during a read count interval RCI1.

Although unlikely, nonvolatile memory system 100 may select a normal block as the source block. In this case, nonvolatile memory system 100 may adjust the reclaim policy based on the first P/E cycle value PE1 of the normal block. In more detail, as illustrated in a second section of FIG. 10, nonvolatile memory system 100 may adjust a read count interval for the reclaim operation for the normal block as the first read count interval RCI1. For example, the first read count interval RCI1 may be greater than the second read count interval RCI2.

In other words, when a normal block is selected as the source block, as an interval between two adjacent ones of the first to fourth sub-operations SO1 to SO4 increases, a reclaim operation may be performed during a number of read counts (or time period) which the number is greater (or longer) than that of a depleted or deteriorated block.

In example embodiments, a point in time or period when each of the first to fourth sub-operations SO1 to SO4 is performed may be an overhead due to the reclaim operation. That is, the performance of nonvolatile memory system 100 may decrease as the number of times that sub-operations for a reclaim operation are performed in the same interval increases.

As described above, during a reclaim operation for a normal block of which the number of P/E cycles is small, nonvolatile memory system 100 according to an embodiment of the inventive concept may increase a read count interval RCI, thereby preventing the performance from being reduced due to the reclaim operation. For example, in the case where a sub-operation is performed every first read count interval RCI1 greater than the second read count interval RCI2, the number of times that sub-operations are performed per unit time may decrease compared with the case that a sub-operation is performed every second read count interval RCI2. This may mean that the number of sub-operations which are performed in the same time interval decreases. For this reason, an overhead due to a sub-operation (or a reclaim operation) during the same time period may decrease.

Thus, according to an embodiment of the inventive concept, nonvolatile memory system 100 may secure integrity of data through the reclaim operation while limiting degradation of the performance of the system.

In example embodiments, although not shown, nonvolatile memory system 100 may increase a sub-operation unit as the number of P/E cycles which have been performed on the source block increases. The sub-operation unit may indicate a number of data units to be processed during a sub-operation. That is, a sub-operation unit may increase as the number of P/E cycles increases, thereby reducing the reclaim execution period RP.

Figure 11:
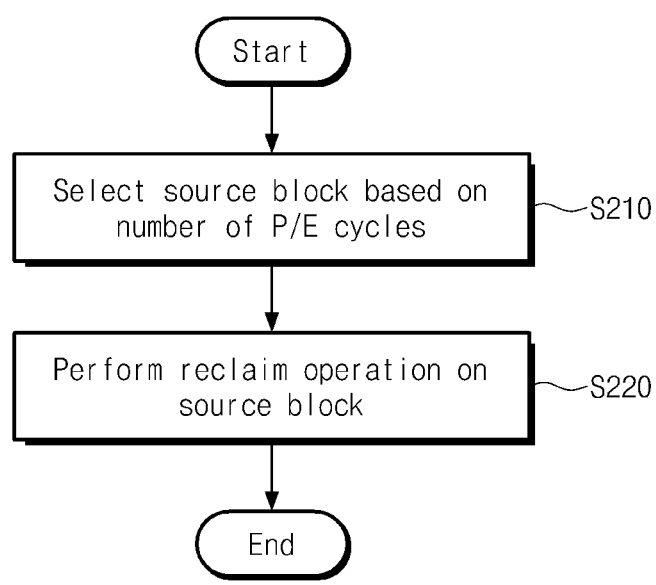
FIG. 11 is a flow chart illustrating another operation of a nonvolatile memory system of FIG. 1.

FIG. 11 is a flow chart illustrating another operation of a nonvolatile memory system 100 of FIG. 1. Referring to FIGS. 1 and 11, in step S210, nonvolatile memory system 100 may select a source block based on the number of P/E cycles. For example, as described above, memory controller 110 may detect errors of data read from nonvolatile memory device 120 and may correct the errors. Memory controller 110 may adjust a reference value based on the number of P/E cycles of a memory block in which the read data is stored. Memory controller 110 may determine whether the detected errors are greater than or equal to the adjusted reference value, and memory controller 110 may select a memory block, in which the number of error bits which are included is greater than or equal to the reference value, as the source block when the number detected error is greater than or equal to the adjusted reference value.

In step S220, nonvolatile memory system 100 may perform a reclaim operation for the selected source block. For example, nonvolatile memory system 100 may perform a reclaim operation for the selected source block based on a predetermined reclaim policy.

Figure 12:
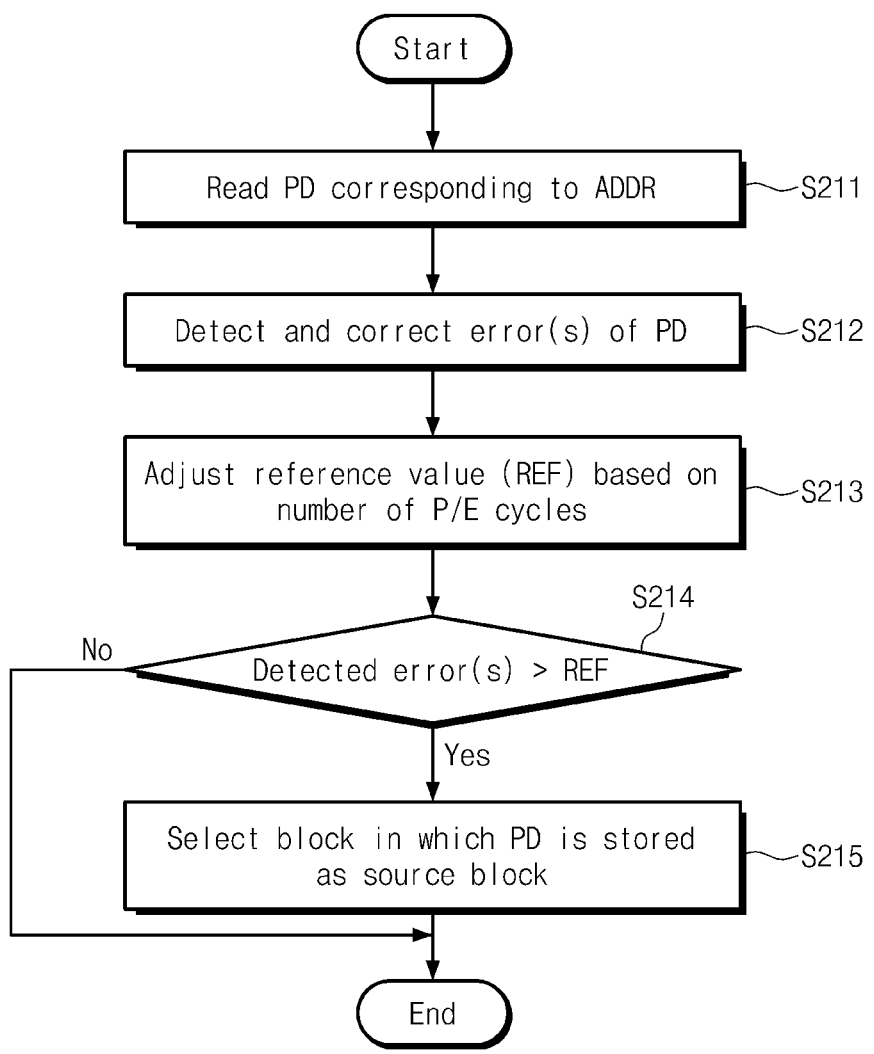
FIG. 12 is a flow chart illustrating step S210 illustrated in FIG. 11 in more detail.

FIG. 12 is a flow chart illustrating an embodiment of step S210 illustrated in FIG. 11. Referring to FIGS. 1, 11 and 12, in step S211, nonvolatile memory system 100 may read page data PD corresponding to the address ADDR. For example, nonvolatile memory system 100 may read the page data PD corresponding to the address ADDR based on the request of an external device. In example embodiments, the address ADDR may be a physical address into which a logical address is converted based on the request of the external device which includes the logical address.

In step S212, nonvolatile memory system 100 may detect and correct one or more errors of the read page data PD. For example, ECC circuit 111 may detect and correct the error(s) of the read page data PD based on an error correction code corresponding to the read page data PD.

In step S213, nonvolatile memory system 100 may adjust the reference value REF. For example, nonvolatile memory system 100 may adjust the reference value REF for selecting the source block based on the number of P/E cycles of a memory block in which the read page data PD is stored. For example, the reference value may decrease as the number of P/E cycles increases.

In step S214, nonvolatile memory system 100 may compare the adjusted reference value REF with the number of the detected error bits.

When the number of the detected error bits is greater than the adjusted reference value REF, then in step S215, nonvolatile memory system 100 may select the memory block, in which the read page data PD is stored, as the source block. When the number of the detected error bits is not greater than the adjusted reference value REF, nonvolatile memory system 100 may not perform a special additional operation or may perform another operation.

Figure 13:
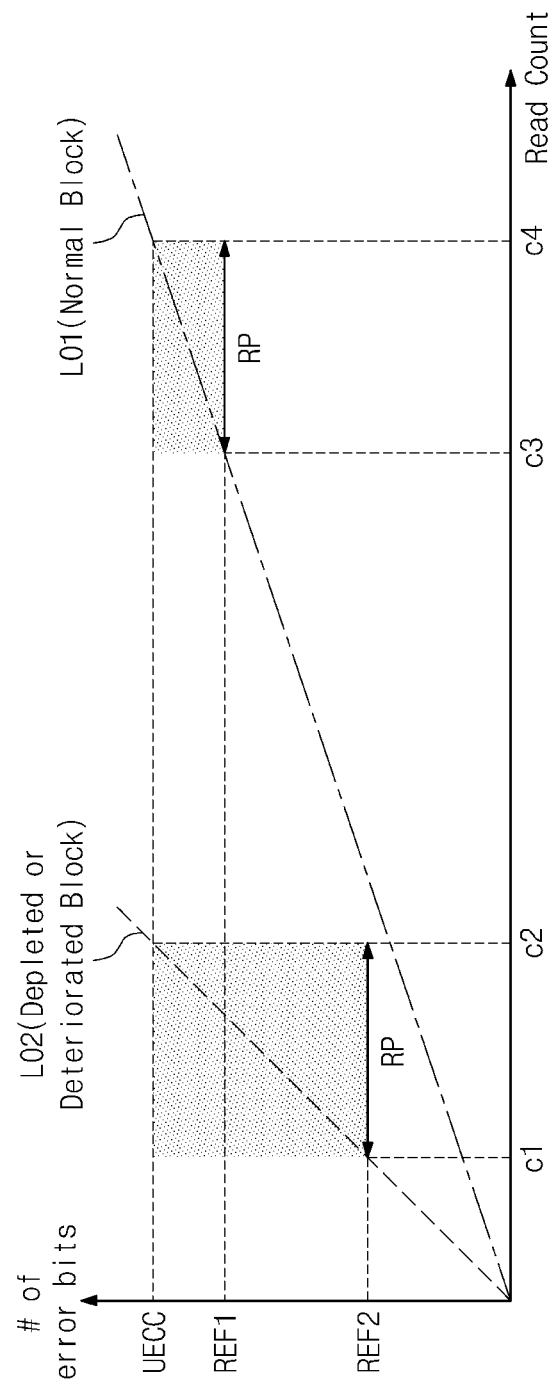
FIGS. 13 and 14 are graphs for describing an operation method of FIG. 11 in detail.
Figure 14:
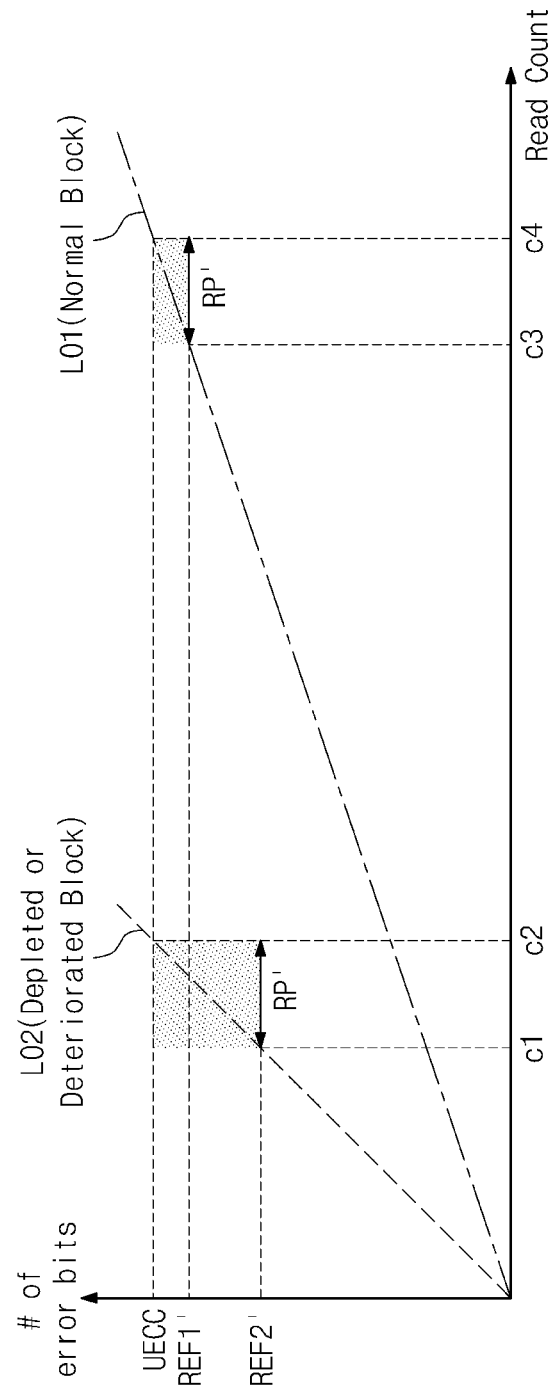

FIGS. 13 and 14 are graphs for describing an operation method of FIG. 11 in more detail. In FIGS. 13 and 14, the X-axis indicates a read count, and the Y-axis thereof indicates the number of error bits. For descriptive convenience, a description of the above-described components or a duplicated description may be omitted.

Referring to FIGS. 1, 11 and 13, a reclaim execution period RP for each of a normal block and a depleted or deteriorated block may be the same as each other. However, nonvolatile memory system 100 may compare a first reference value REF1 with the number of the error bits of the normal block and may select the normal block as the source block using the comparison result. Nonvolatile memory system 100 may compare a second reference value REF2 with the number of the error bits of the normal block and may select the normal block as the source block using the comparison result. At this time, the second reference value REF2 may be less than the first reference value REF1. That is, as the number of P/E cycles of a memory block increases, nonvolatile memory system 100 may decrease a reference value for selecting the source block to secure enough reclaim margin (RM). Since the reclaim execution period RP is secured according to the secured reclaim margin (RM), the performance of the nonvolatile memory system may be improved as the number of occurrences of a reclaim operation per unit time decreases.

Referring to FIGS. 1, 11 and 14, similarly to an embodiment of FIG. 13, the reclaim execution period RP' for each of a normal block and a depleted or deteriorated block may be the same as each other, and a first reference value REF1' for selecting the normal block as the source block may be greater than a second reference value REF2' for selecting the depleted or deteriorated block as the source block. Unlike an embodiment of FIG. 13, the reclaim execution period RP' of FIG. 14 may be less than that of FIG. 13. In an embodiment of FIG. 13, the reference value may decrease as the number of P/E cycles increases, based on a normal block. However, in an embodiment of FIG. 14, the reference value may increase as the number of P/E cycles decreases, based on a depleted or deteriorated block.

In example embodiments, according to an embodiment of FIG. 13, since the reclaim operation (or sub-operation) performed per unit read count decreases as the reclaim execution period RP increases, the performance of a nonvolatile memory system may be improved. According to an embodiment of FIG. 14, a point in time (or a read count) when the normal block is selected as the source block may be extended, thereby reducing the total number of occurrences of a reclaim operation. For this reason, the whole life of the nonvolatile memory system 100 may be improved.

Figure 15:
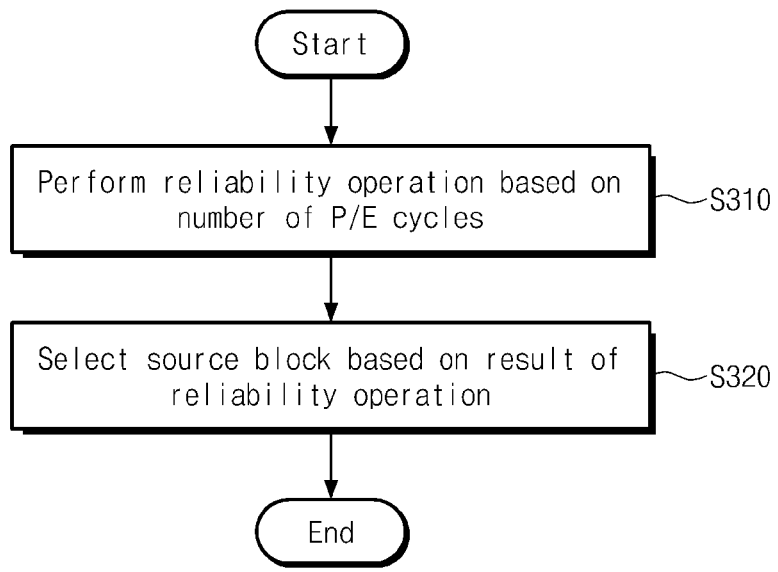
FIG. 15 is a flow chart illustrating another operation of a nonvolatile memory system of FIG. 1.

FIG. 15 is a flow chart illustrating another operation of nonvolatile memory system 100 of FIG. 1. Referring to FIGS. 1 and 15, in step S310, nonvolatile memory system 100 may perform a reliability maintenance operation based on the number of P/E cycles of a memory block. For example, the reliability operation may indicate an operation of reading data from nonvolatile memory device 120 through a read operation at least once, detecting any errors of the read data, and comparing any detected error(s) with a reference value. At this time, the nonvolatile memory system may adjust the reference value based on the number of P/E cycles of a memory block in which the read data is stored. A method of adjusting the reference value based on the number of P/E cycles is described with reference to FIG. 14, and a detailed description thereof is thus omitted. In example embodiments, nonvolatile memory system 100 may perform a reliability operation based on various methods and may select the source block based on the result of the reliability operation. In example embodiments, nonvolatile memory system 100 may read a specific memory block for a specific read count, or a word line, or data stored in a page, and may detect the number of errors of the read data. Nonvolatile memory system 100 may compare the number of the detected errors with the reference value and may select the source block using the comparison result.

In step S320, nonvolatile memory system 100 may select the source block based on the result of the reliability maintenance operation. For example, as described above, when the number of error bits of the read data is greater than the reference value, nonvolatile memory system 100 may select the memory block, in which the read data is stored, as the source block.

Although not shown, nonvolatile memory system 100 may perform a reclaim operation for the selected source block.

Figure 16:
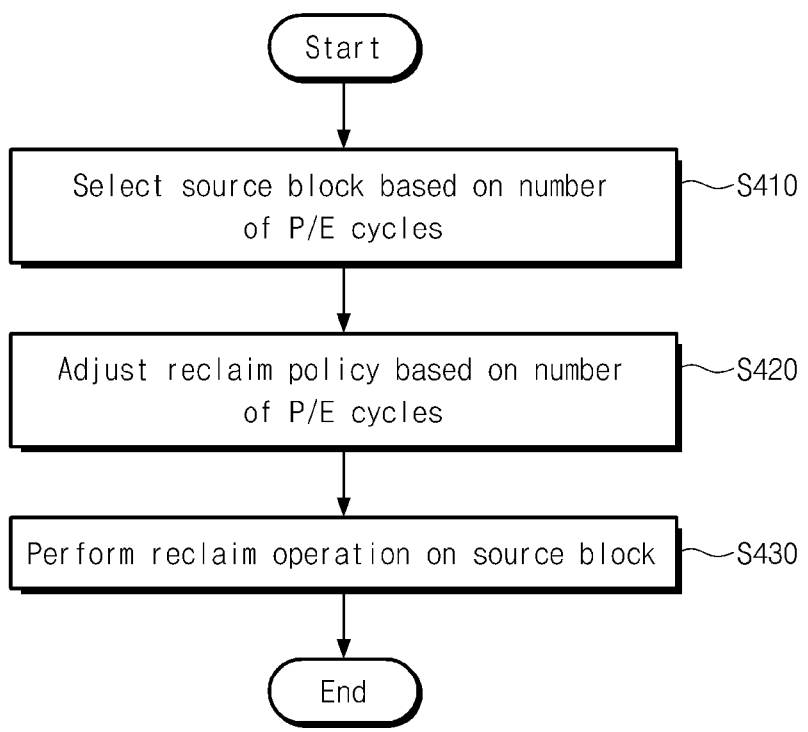
FIG. 16 is a flow chart illustrating another operation of a nonvolatile memory system of FIG. 1.

FIG. 16 is a flow chart illustrating another operation of nonvolatile memory system 100 of FIG. 1. Referring to FIGS. 1 and 16, in step S410, nonvolatile memory system 100 may select a source block based on the number of P/E cycles. For example, nonvolatile memory system 100 may select the source block based on an operation method described with reference to FIGS. 11 to 15.

In step S420, nonvolatile memory system 100 may adjust a reclaim policy based on the number of P/E cycles of the selected source block. For example, nonvolatile memory system 100 may adjust a reclaim policy based on a method described with reference to FIGS. 1 to 10.

In step S430, nonvolatile memory system 100 may perform a reclaim operation based on the adjusted reclaim policy.

As described above, nonvolatile memory system 100 according to an embodiment of the inventive concept may select the source block based on the number of P/E cycles of each memory block and may adjust the reclaim policy based on the number of P/E cycles of the selected source block. Thus, the nonvolatile memory system having improved reliability and improved performance may be provided.

Figure 17:
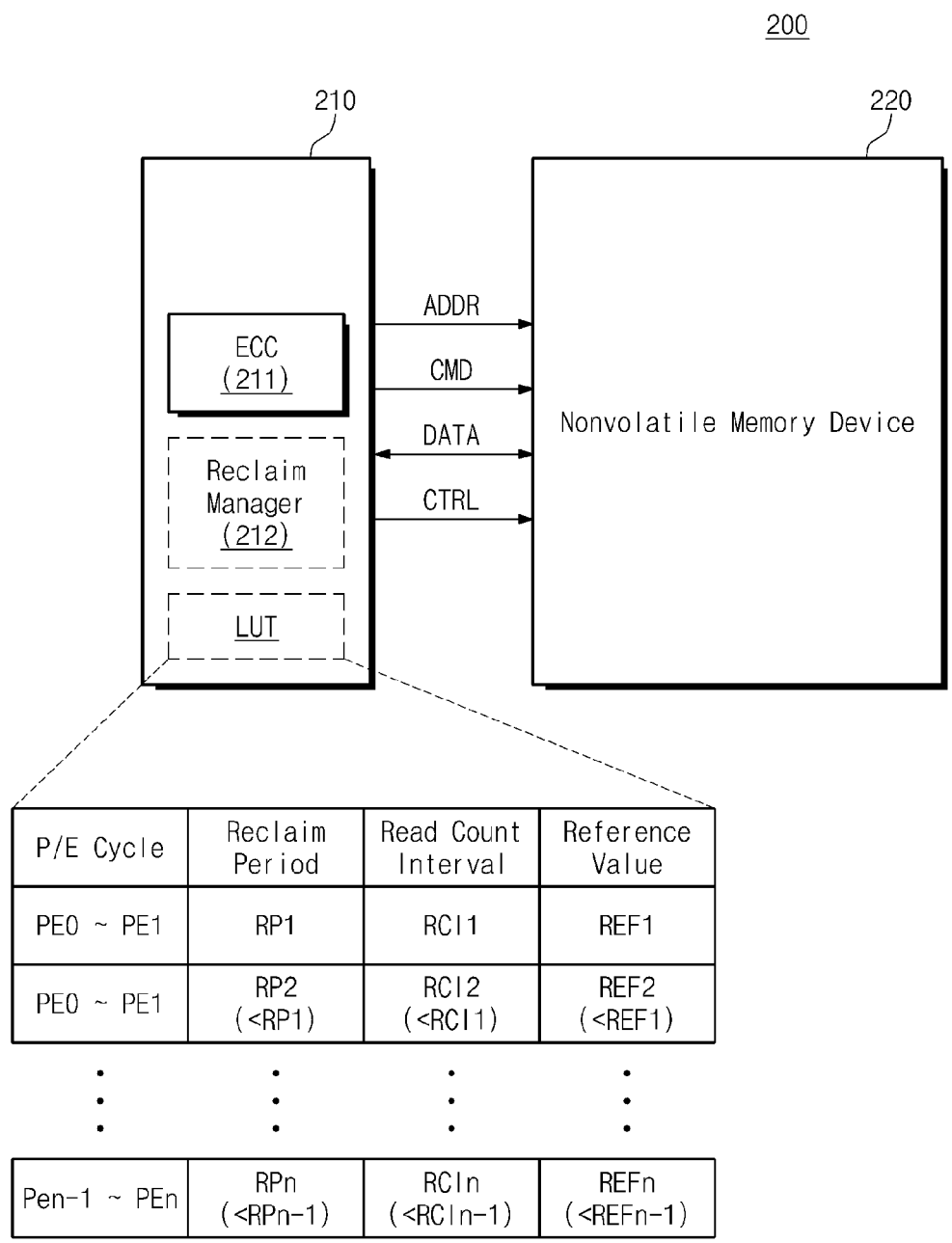
FIG. 17 is a block diagram illustrating a nonvolatile memory system 200 according to an embodiment of the inventive concept.

FIG. 17 is a block diagram illustrating a nonvolatile memory system 200 according to an embodiment of the inventive concept. Referring to FIG. 17, nonvolatile memory system 200 may include a memory controller 210 and a nonvolatile memory device 220. Memory controller 210 may include an ECC circuit 211, a reclaim manager 212, and a look-up table LUT. Memory controller 210, nonvolatile memory device 220, ECC circuit 211, and reclaim manager 212 are described with reference to FIG. 1, and a detailed description thereof is thus omitted.

In example embodiments, embodiments of FIGS. 1 to 16 are described based on memory blocks (e.g., a normal block and a depleted or deteriorated block) having the number of specific P/E cycles. However, an embodiment of the inventive concept may not be limited thereto.

As illustrated in FIG. 17, memory controller 210 may include the look-up table LUT. The look-up table LUT may include information of a reclaim policy dependent on the number of P/E cycles. Memory controller 210 may adjust the reclaim policy for the source block with reference to the look-up table LUT. For example, memory controller 110 may adjust the reclaim policy such that a reclaim operation is performed with respect to memory blocks having a P/E cycle between $0^{th}$ and $1^{st}$ P/E cycles PE0 and PE1 with reference to the look-up table LUT based on the first reference value REF1, the first reclaim execution period RP1, or the first read count interval RCI1. Alternatively, memory controller 110 may adjust the reclaim policy such that the reclaim operation is performed with respect to memory blocks having a P/E cycle between $1^{st}$ and $2^{nd}$ P/E cycles PE1 and PE2 based on a second reference value REF2, the second reclaim execution period RP2, or the second read count interval RCI2. At this time, as the number of P/E cycles increases, the reclaim execution period RP, the read count interval RCI, and the reference value may decrease.

As described above, memory controller 210 may classify a plurality of memory blocks included in nonvolatile memory device 220 into specific groups based on the number of P/E cycles and may apply different reclaim policies to the plurality of memory blocks based on the classified groups.

Figure 18:
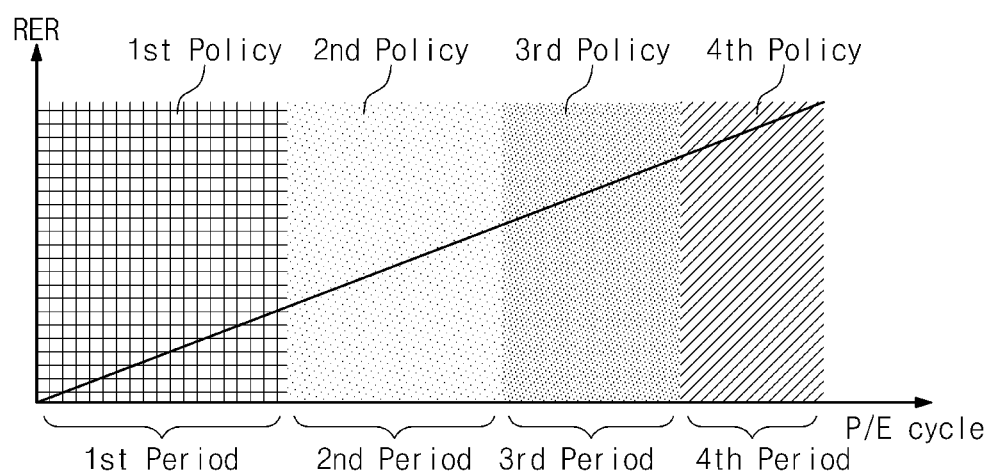
FIG. 18 is a graph for describing an operation of a nonvolatile memory system of FIG. 17.

FIG. 18 is a graph for describing an operation of nonvolatile memory system 200 of FIG. 17. In FIG. 18, the X-axis indicates a number or P/E cycles, and the Y-axis indicates a ratio of the number of error bits to a read count (RER). In example embodiments, a term of "the ratio of the number of error bits to a read count" may indicate at the number of error bits at a certain read count. If a read count is constant, the number of error bits increase as a value of the ratio increase. Referring to FIGS. 17 and 18, similarly to that described with reference to FIG. 6, the ratio of the number of error bits to a read count may increase in the plurality of memory blocks included in nonvolatile memory device 220 as the number of P/E cycles increases.

As described above, memory controller 210 may apply different reclaim policies to the memory blocks based on the number of P/E cycles of a memory block. For example, memory controller 210 may perform a reclaim operation with respect to the memory blocks for which the number of P/E cycles is within a first period, based on a first reclaim policy. Memory controller 210 may perform a reclaim operation with respect to the memory blocks for which the number of P/E cycles is within in a second period, based on the second reclaim policy. At this time, a second reclaim policy may have a lower reference value, a smaller reclaim execution period, a smaller sub-operation interval, and/or a greater sub-operation unit than for the first reclaim policy. Likewise, memory controller 210 may apply a third reclaim policy with respect to memory blocks for which the number of P/E cycles is within a third period, and may apply a fourth reclaim policy with respect to memory blocks for which the number of P/E cycles is within in a fourth period.

As described above, memory controller 210 may apply different reclaim policies to the memory blocks based on the number of P/E cycles which have been performed on the memory block and may reduce an overhead due to a reclaim operation, thereby improving the total performance. In addition, the reclaim operation for a source block may be completed before the UECC data is generated, thereby improving the reliability of the nonvolatile memory system.

In example embodiments, according to an embodiment of the inventive concept, the nonvolatile memory system may adjust a reclaim policy with reference to the number of P/E cycles of the source block. However, an embodiment of the inventive concept may not be limited thereto. For example, nonvolatile memory system 100 may adjust a reclaim policy based on one or more factors such as time or temperature, related to the probability that one or more bit errors occur in a source block. That is, the ratio of the number of error bits to the read count may decrease as temperature of the nonvolatile memory system decreases. That is, the nonvolatile memory system may increase a reclaim period as the temperature decreases, thereby reducing an overhead due to the reclaim operation. In general, according to an embodiment of the inventive concept, the nonvolatile memory system may select a value for a parameter ("first parameter") of a reclaim operation, wherein the first parameter affects an overhead for operations of the nonvolatile memory system due to the reclaim operation, based on a value of a parameter ("second parameter") of the source block which is related to the probability that one or more bit errors occur in the source block. The first parameter may be the reference value, reclaim speed, reclaim execution period, sub-operation period of the reclaim operation, sub-operation unit of the reclaim operation, etc. as described above. The second parameter may be the number of P/E cycles which have been performed on the source block, temperature of the source block, etc.

Figure 19:
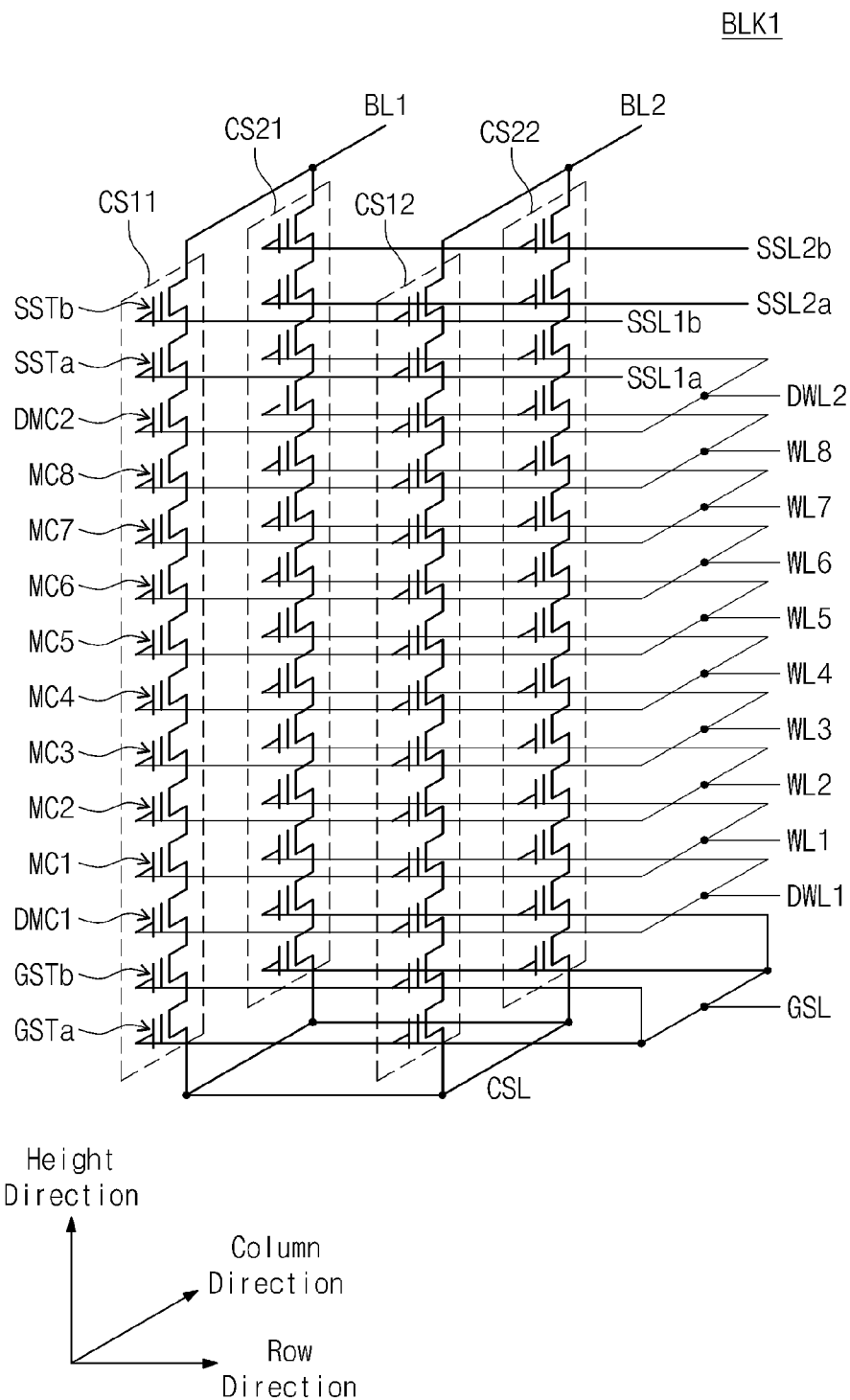
FIG. 19 is a circuit diagram schematically illustrating a first memory block of memory blocks included in a nonvolatile memory device according to an embodiment of the inventive concept.

FIG. 19 is a circuit diagram schematically illustrating a first memory block of memory blocks included in a nonvolatile memory device according to an embodiment of the inventive concept. In example embodiments, a first memory block BLK1 having a 3-dimensional structure will be described with reference to FIG. 19. However, an embodiment of the inventive concept is not limited thereto, and other memory blocks may also have a structure which is similar to the first memory block BLK1.

Referring to FIG. 19, the first memory block BLK1 may include a plurality of cell strings CS11, CS12, CS21, and CS22. The cell strings CS11, CS12, CS21, and CS22 may be arranged along a row direction and a column direction and may form rows and columns.

Each of the cell strings CS11, CS12, CS21, and CS22 may include a plurality of cell transistors. For example, each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2. In example embodiments, each of the memory cells included in the cell strings CS11, CS12, CS21, and CS22 may be a charge trap flash (CTF) memory cell.

The memory cells MC1 to MC8 may be serially connected and may be stacked in a height direction being a direction perpendicular to a plane defined by a row direction and a column direction. The string selection transistors SSTa and SSTb may be serially connected and may be disposed between the memory cells MC1 to MC8 and a bit line BL.

The ground selection transistors GSTa and GSTb may be serially connected and may be disposed between the memory cells MC1 to MC8 and a common source line CSL.

In example embodiments, a first dummy memory cell DMC1 may be disposed between the memory cells MC1 to MC8 and the ground selection transistors GSTa and GSTb. In example embodiments, a second dummy memory cell DMC2 may be disposed between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In example embodiments, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to the first ground selection line, and the first ground selection transistors GSTa of the cell strings CS21 and CS22 in the second row may be connected to the second ground selection line.

In example embodiments, although not shown, ground selection transistors provided at the same height from a substrate (not shown) may be connected to the same ground selection line, and ground selection transistors provided at different heights may be connected to different ground selection lines. For example, the first ground selection transistors GSTa of the cell strings CS11, CS12, CS21, and CS22 may be connected to the first ground selection line, and the second ground selection transistors GSTb thereof may be connected to the second ground selection line.

Memory cells placed at the same height from the substrate (or the ground selection transistors GSTa and GSTb) may be connected in common to the same word line, and memory cells placed at different heights therefrom may be connected to different word lines. For example, memory cells MC1 to MC8 of the cell strings CS11, CS12, CS21, and CS22 may be connected in common to first to eighth word lines WL1 to WL8, respectively.

String selection transistors, belonging to the same row, from among the first string selection transistors SSTa at the same height may be connected to the same string selection line, and string selection transistors belonging to different rows may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL2a.

Likewise, string selection transistors, belonging to the same row, from among the second string selection transistors SSTb at the same height may be connected to the same string selection line, and string selection transistors in different rows may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

Although not shown, string selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In example embodiments, dummy memory cells at the same height may be connected with the same dummy word line, and dummy memory cells at different heights may be connected with different dummy word lines. For example, the first dummy memory cells DMC1 may be connected to a first dummy word line DWL1, and the second dummy memory cells DMC2 may be connected to a second dummy word line DWL2.

The first memory block BLK1 illustrated in FIG. 19 may be an example. For example, the number of cell strings may increase or decrease, and the number of rows of cell strings and the number of columns of cell strings may increase or decrease according to the number of cell strings. In addition, in the first memory block BLK1, the number of cell strings (GST, MC, DMC, SST, or the like) may increase or decrease, and the height of the first memory block BLK1 may increase or decrease according to the number of cell strings. Furthermore, the number of lines (GSL, WL, DWL, SSL, or the like) connected with cell transistors may increase or decrease according to the number of cell strings (GST, MC, DMC, SST, or the like).

Figure 20:
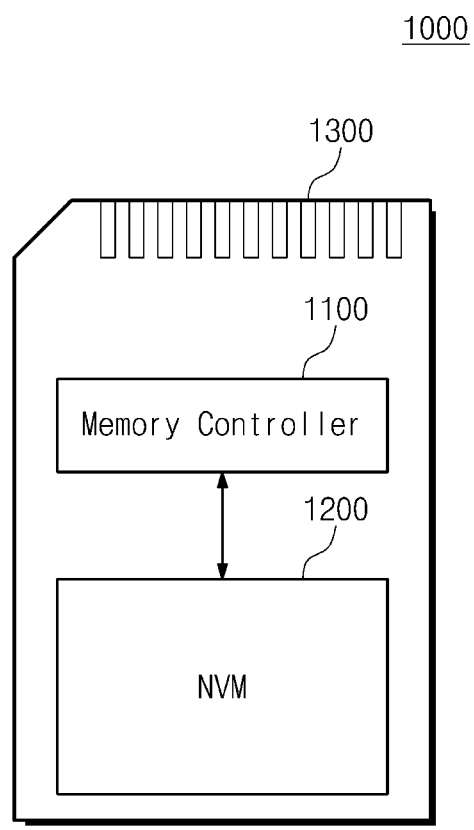
FIG. 20 is a block diagram schematically illustrating a memory card system to which a nonvolatile memory module according to the inventive concept is applied.

FIG. 20 is a block diagram illustrating a memory card system 1000 including a nonvolatile memory system according to an embodiment of the inventive concept. In example embodiments, memory card system 1000 of FIG. 20 may operate according to an operation method of the nonvolatile memory system described with reference to FIGS. 1 to 18.

Referring to FIG. 20, memory card system 1000 may include a controller (memory controller) 1100, a nonvolatile memory 1200, and a connector 1300.

Controller 1100 may be connected to nonvolatile memory 1200. Controller 1100 may be configured to access nonvolatile memory 1200. For example, controller 1100 may be adapted to control an overall operation of nonvolatile memory 1200 including, but not limited to, a read operation, a write operation, an erase operation, and one or more background operations. Background operations may include the following operations: wear-leveling management, garbage collection, and the like.

Controller 1100 may provide an interface between nonvolatile memory 1200 and a host. Controller 1100 may be configured to drive firmware for controlling nonvolatile memory 1200.

In example embodiments, controller 1100 may include elements such as, but not limited to, a RAM, a processing unit, a host interface, a memory interface, and an error correction unit.

Controller 1100 may communicate with an external device through connector 1300. Controller 1100 may communicate with the external device (e.g., host) based on a specific communication protocol. For example, controller 1100 may communicate with the external device through at least one of various communication protocols such as, but not limited to, universal serial bus (USB), multimedia card (MMC), embedded MMC (eMMC), peripheral component interconnection (PCI), PCI-express (PCI-E), advanced technology attachment (ATA), a serial-ATA, a parallel-ATA, small computer small interface (SCSI), enhanced small disk interface (ESDI), integrated drive electronics (IDE), Firewire, universal flash storage (UFS), and nonvolatile memory express (NVMe).

Nonvolatile memory 1200 may be implemented with a variety of nonvolatile memory devices, such as, but not limited to, an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In example embodiments, controller 1100 and nonvolatile memory 1200 may be integrated in a single semiconductor device. In example embodiments, controller 1100 and nonvolatile memory 1200 may be integrated in a single semiconductor device to form a solid state drive (SSD). Controller 1100 and nonvolatile memory 1200 may be integrated in a single semiconductor device to constitute a memory card. For example, controller 1100 and nonvolatile memory 1200 may be integrated in a single semiconductor device to compose a memory card such as, a personal computer memory card international association (PCMCIA) card, a compact flash card (CF), a smart media card (e.g., SM and SMC), a memory stick, a multimedia card (e.g., MMC, RS-MMC, MMCmicro, and eMMC), an SD card (e.g., SD, miniSD, microSD, and SDHC), or a universal flash storage (UFS).

Nonvolatile memory 1200 or memory card system 1000 may be mounted with a variety of types of packages. For example, nonvolatile memory 1200 or memory card system 1000 may be packaged and mounted with a package: package on package (POP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline integrated circuit (SOIC), shrink small outline package (SSOP), thin small outline package (TSOP), thin quad flat package (TQFP), system in package (SIP), multichip package (MCP), wafer-level fabricated package (WFP), or wafer-level processed stack package (WSP).

Figure 21:
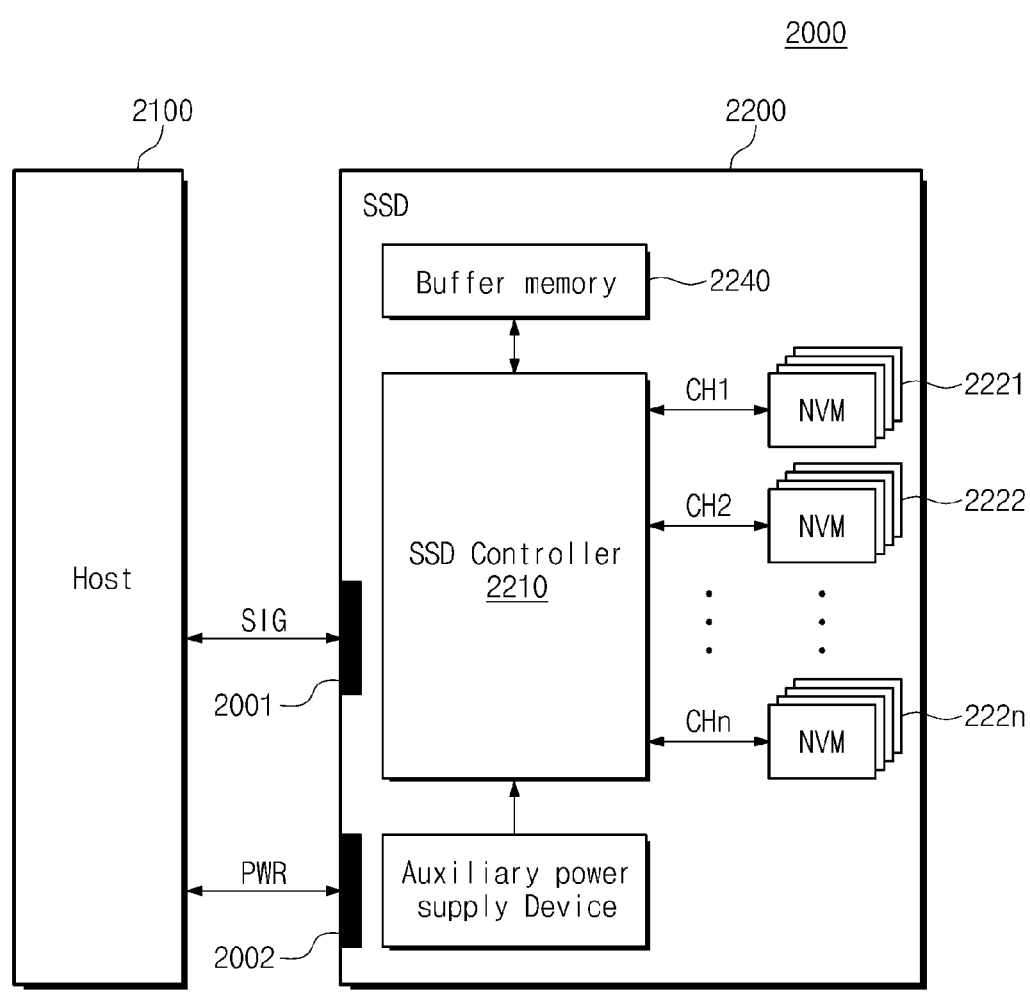
FIG. 21 is a block diagram illustrating a solid state drive (SSD) to which a nonvolatile memory system according to an embodiment of the inventive concept is applied.

FIG. 21 is a block diagram illustrating a solid state drive (SSD) system 2000 including a nonvolatile memory system according to an embodiment of the inventive concept. In example embodiments, SSD system 2000 of FIG. 21 may operate according to a method described with reference to FIGS. 1 to 17.

Referring to FIG. 21, solid state drive (SSD) system 2000 may include a host 2100 and an SSD 2200. SSD 2200 may exchange signals SIG with host 2100 through a signal connector 2001 and may be supplied with a power PWR through a power connector 2002. SSD 2200 may include an SSD controller 2210, a plurality of flash memories 2221 to 222n, an auxiliary power supply device 2230, and a buffer memory 2240.

SSD controller 2210 may control flash memories 2221 to 222n in response to the signal SIG from host 2100. Flash memories 2221 to 222n may perform a programming operation under control of SSD controller 2210.

Auxiliary power supply device 2230 may be connected to host 2100 via power connector 2002. Auxiliary power supply device 2230 may receive the power PWR from host 2100 and may be charged with the received power PWR. When power is not smoothly supplied from host 2100, auxiliary power supply device 2230 may supply an auxiliary power to SSD 2200. In example embodiments, auxiliary power supply device 2230 may be placed inside or outside SSD 2200. For example, auxiliary power supply device 2230 may be put on a main board or a separate printed circuit board to supply the auxiliary power to SSD 2200.

Buffer memory 2240 may act as a buffer memory of SSD 2200. For example, buffer memory 2240 may temporarily store data received from host 2100 or from flash memories 2221 to 222n or may temporarily store metadata (e.g., mapping tables) of flash memories 2221 to 222*n*. Buffer memory 2240 may include volatile memories such as a DRAM, a SDRAM, a DDR SDRAM, an LPDDR SDRAM, and an SRAM or nonvolatile memories such as a FRAM a ReRAM, a STT-MRAM, and a PRAM.

Figure 22:
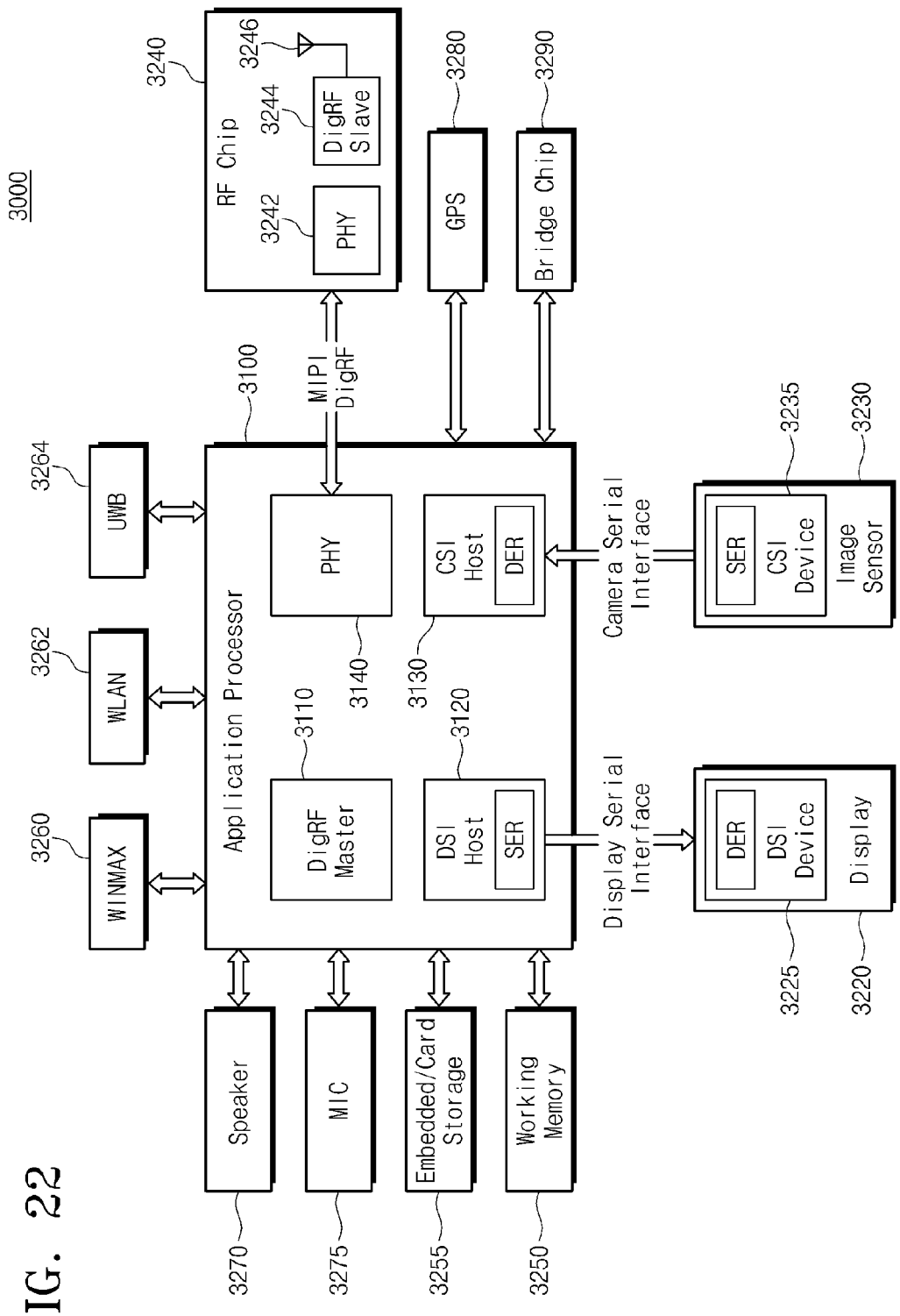
FIG. 22 is a block diagram illustrating an electronic system including a nonvolatile memory system according to an embodiment of the inventive concept.

FIG. 22 is a block diagram illustrating an electronic system 3000 including a nonvolatile memory system according to an embodiment of the inventive concept. In example embodiments, electronic system 3000 may be implemented with a data processing device capable of using or supporting an interface offered by mobile industry processor interface (MIPI) alliance. In example embodiments, electronic system 3000 may be implemented with an electronic device such as a portable communication terminal, a personal digital assistant (PDA), a portable multimedia player (PMP), a smart phone, or a wearable device.

Referring to FIG. 22, electronic system 3000 may include an application processor 3100, a display 3220, and an image sensor 3230. Application processor 3100 may include a DigRF master 3110, a display serial interface (DSI) host 3120, a camera serial interface (CSI) host 3130, and a physical layer 3140.

DSI host 3120 may communicate with a DSI device 3225 of display 3220 through the DSI. In example embodiments, an optical serializer SER may be implemented in DSI host 3120. In example embodiments, an optical deserializer DES may be implemented in DSI device 3225.

CSI host 3130 may communicate with a CSI device 3235 of image sensor 3230 through a CSI. In example embodiments, an optical deserializer DES may be implemented in CSI host 3130. In example embodiments, an optical serializer may be implemented in CSI device 3235.

Electronic system 3000 may further include a radio frequency (RF) chip 3240 for communicating with application processor 3100. RF chip 3240 may include a physical layer 3242, a DigRF slave 3244, and an antenna 3246. In example embodiments, physical layer 3242 of RF chip 3240 and physical layer 3140 of application processor 3100 may exchange data with each other through DigRF interface offered by MIPI alliance.

Electronic system 3000 may further include a working memory 3250 and embedded/card storage 3255. Working memory 3250 and embedded/card storage 3255 may store data received from application processor 3100. Working memory 3250 and embedded/card storage 3255 may provide the data stored therein to application processor 3100.

Working memory 3250 may temporarily store data, which was processed or will be processed by application processor 3100. Working memory 3250 may include a nonvolatile memory, such as a flash memory, a PRAM, an MRAM, an ReRAM, or a FRAM, or a volatile memory, such as an SRAM, a DRAM, or an SDRAM.

Embedded/card storage 3255 may store data regardless of a power supply. In example embodiments, embedded/card storage 3255 may comply with the UFS interface protocol. However, the scope of the inventive concept may not be limited thereto. In example embodiments, embedded/card storage 3255 may include a nonvolatile memory system described with reference to FIGS. 1 to 17. In example embodiments, embedded/card storage 3255 may operate according to an operation method of the nonvolatile memory system described with reference to FIGS. 1 to 17.

Electronic system 3000 may communicate with an external system through a worldwide interoperability for microwave access (WiMAX) 3260, a wireless local area network (WLAN) 3262, and an ultra-wideband (UWB) 3264, or the like.

Electronic system 3000 may further include a speaker 3270 and a microphone 3275 for processing voice information. In example embodiments, electronic system 3000 may further include a global positioning system (GPS) device 3280 for processing location information. Electronic system 3000 may further include a bridge chip 3290 for managing connections between peripheral devices.

In an embodiment of the inventive concept, the nonvolatile memory device (NVM) may include a 3-dimensional memory array. The 3-dimensional memory array may be monolithically formed in one or more physical level(s) of arrays of memory cells having an active area arranged on a circuit related on a silicon substrate and an operation of memory cells. The circuit related on an operation of the memory cells may be located in a substrate or on a substrate. A term "monolithically" may mean that layers of each level in a 3-dimensional array are directly deposited on layers of low-level in the 3-dimensional array.

In an embodiment of the inventive concept, the 3-dimensional memory array includes vertical NAND strings that are vertically oriented such that at least one memory cell is located over another memory cell. At least one memory cell may include a charge trap layer. Each vertical NAND string may include at least one select transistor located over memory cells. The at least one selection transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

According to the above-described embodiments of the inventive concept, a nonvolatile memory system may control a reclaim operation for a source block based on the number of P/E cycles which have been performed on the source block. Accordingly, a nonvolatile memory system with an improved performance and reliability and an operation method thereof may be provided.

Embodiments of the inventive concepts provide an operation method of a nonvolatile memory system having an improved performance by adjusting a reclaim policy for a source block based on the number of program and erase cycles which have been performed on the source block.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, and it is to be understood that the technical value substantially affects the equivalent scope of the invention.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of operation for a nonvolatile memory system, the method comprising:
   selecting a source block from among a plurality of memory blocks in the nonvolatile memory system; and performing a reclaim operation for the source block based on a number of program and erase (P/E) cycles which have been performed on the source block, including when the number of P/E cycles which have been performed on the source block is a first value, performing the reclaim operation for the source block at a first speed, and when the number of P/E cycles which have been performed on the source block is a second value greater than the first value, performing the reclaim operation for the source block at a second speed which is faster than the first speed.

2. The method of claim 1, wherein the reclaim operation comprises a plurality of sub-operations, and wherein the performing of the reclaim operation comprises:

performing the sub-operations at intervals of a first read count, when the number of program and erase cycles of the source block is a first value; and performing the sub-operations at intervals of a second read count greater than the first read count when the number of program and erase cycles of the source block is a second value which is less than the first value.

3. The method of claim 2, wherein each of the sub-operations comprises at least one of:

reading at least one page of data of a plurality of pages of data included in the source block;

correcting one or more errors of the read at least one page of data; or programming the corrected at least one page data to a destination block.

4. The method of claim 2, wherein each of the first read count and the second read count indicates a number of occurrences of read operations performed according to a request of an external device.

5. The method of claim 1, wherein the performing of the reclaim operation comprises:

performing the reclaim operation during a first reclaim execution period, when the number of program and erase cycles of the source block is a first value; and performing the reclaim operation during a second reclaim execution period which is greater than the first reclaim execution period, when the number of program and erase cycles of the source block is a second value which is less than the first value.

6. The method of claim 5, wherein each of the first and second reclaim execution periods indicates a read count that is from a point in time when the source block is selected, to a point in time when the reclaim operation is completed.

7. The method of claim 1, wherein the selecting of the source block comprises:

reading data from at least one of the plurality of memory blocks; and selecting a memory block, in which the read data is stored, as the source block when a number of errors in the read data is greater than a reference value.

8. The method of claim 7, wherein the selecting of the source block further comprises:

adjusting the reference value based on a number of program and erase cycles of the memory block in which the read data is stored.

9. The method of claim 8, wherein the adjusting of the reference value comprises:

adjusting the reference value to a first reference value when the number of program and erase cycles of the memory block, in which the read data is stored, is a first value; and adjusting the reference value to a second reference value greater than the first reference value when the number of program and erase cycles of the memory block in which the read data is stored is a second value which is less than the first value.

10. A method of operation for a nonvolatile memory system, the method comprising:

selecting a source block from among a plurality of memory blocks in the nonvolatile memory system;

adjusting a reclaim policy for the selected source block based on a number of program and erase (P/E) cycles which have been performed on the selected source block, including when the number of P/E cycles which have been performed on the selected source block is a first value, adjusting the reclaim policy to perform a reclaim operation for the selected source block at a first speed, and when the number of P/E cycles which have been performed on the selected source block is a second value greater than the first value, adjusting the reclaim policy to perform the reclaim operation for the selected source block at a second speed which is faster than the first speed; and performing the reclaim operation for the selected source block based on the adjusted reclaim policy.

11. The method of claim 10, wherein the reclaim policy includes a reclaim execution period for the reclaim operation, and wherein the adjusting of the reclaim policy comprises:

adjusting the reclaim execution period to a first period when the number of the program and erase cycles which have been performed on the selected source block is a first value; and adjusting the reclaim execution period to a second period longer than the first period when the number of the program and erase cycles of the selected source block is a second value smaller than the first value.

12. The method of claim 11, wherein the performing of the reclaim operation comprises:

performing the reclaim operation for the selected source block during the adjusted reclaim execution period.

13. The method of claim 10, wherein the reclaim operation comprises a plurality of sub-operations, wherein the reclaim policy includes a read count interval between each of the sub-operations, and wherein the adjusting of the reclaim policy comprises:

adjusting the read count interval to a first interval when the number of program and erase cycles which have been performed on the selected source block is a first value; and adjusting the read count interval to a second interval greater than the first interval when the number of program and erase cycles which have been performed on the selected source block is less than the first value.

14. The method of claim 10, wherein the reclaim operation comprises a plurality of sub-operations, wherein the reclaim policy comprises a sub-operation unit for at least one of the sub-operations, wherein the adjusting of the reclaim policy comprises:

adjusting the sub-operation unit to a first unit value when the number of the program and erase cycles which have been performed on the selected source block is a first value; and adjusting the sub-operation unit to a second unit value which is less than the first unit value when the number of program and erase cycles which have been performed on the selected source block is less than the first value.

15. A method of operation for a nonvolatile memory system including a nonvolatile memory device having a plurality of memory blocks, the method comprising:
selecting a value for a first parameter of a reclaim operation, wherein the first parameter affects an overhead for operations of the nonvolatile memory system due to the reclaim operation;
selecting a source block from among the plurality of memory blocks in the nonvolatile memory system based on the selected value for the first parameter; and
performing the reclaim operation for the source block,
wherein selecting the value for the first parameter of the reclaim operation is based on a value of a second parameter of the source block which is related to the probability that one or more bit errors occur in the source block,
wherein the first parameter is a reference value,
wherein selecting the source block comprises selecting a memory block in which read data is stored among the plurality of memory blocks, and
where a number of errors in the read data is greater than a reference value.

16. The method of claim 15, wherein the second parameter is a temperature of the source block, wherein the value of the first parameter is selected such that the overhead is reduced as the temperature is reduced.

17. The method of claim 15, wherein the second parameter is a number of program and erase cycles which have been performed on the source block, wherein the value of the first parameter is selected such that the overhead is reduced as the number of program and erase cycles is reduced.

18. The method of claim 15, further comprising adjusting the reference value based on a number of program and erase cycles which have been performed on the memory block in which the read data is stored.

19. The method of claim 15, wherein performing the reclaim operation for the source block comprises performing the reclaim operation based on a value for a third parameter, the third parameter being an execution period in which the reclaim operation is performed.

* * * * *